United States Patent
Sone et al.

(10) Patent No.: US 11,211,123 B2
(45) Date of Patent: Dec. 28, 2021

(54) SEMICONDUCTOR DEVICE

(71) Applicant: SONY SEMICONDUCTOR SOLUTIONS CORPORATION, Kanagawa (JP)

(72) Inventors: Takeyuki Sone, Kanagawa (JP); Seiji Nonoguchi, Kanagawa (JP); Jun Okuno, Kanagawa (JP); Hiroyuki Fujita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/769,663

(22) PCT Filed: Nov. 30, 2018

(86) PCT No.: PCT/JP2018/044233
§ 371 (c)(1),
(2) Date: Jun. 4, 2020

(87) PCT Pub. No.: WO2019/116932
PCT Pub. Date: Jun. 20, 2019

(65) Prior Publication Data
US 2021/0183443 A1  Jun. 17, 2021

(30) Foreign Application Priority Data
Dec. 11, 2017 (JP) .............................. JP2017-236830

(51) Int. Cl.
*G11C 13/00* (2006.01)
*H01L 27/24* (2006.01)
*H01L 45/00* (2006.01)

(52) U.S. Cl.
CPC ........ *G11C 13/0069* (2013.01); *G11C 13/004* (2013.01); *H01L 27/2436* (2013.01); *H01L 45/12* (2013.01)

(58) Field of Classification Search
CPC ... G11C 13/0069; G11C 13/004; H01L 45/12; H01L 27/2436
(Continued)

(56) References Cited

U.S. PATENT DOCUMENTS

2009/0184389 A1* 7/2009 Bertin .................... B82Y 10/00
257/476
2010/0090187 A1* 4/2010 Ahn ........................ H01L 27/24
257/2
(Continued)

FOREIGN PATENT DOCUMENTS

| JP | 2010-157316 | 7/2010 |
|---|---|---|
| JP | 2014-216047 | 11/2014 |
| JP | 2016-062627 | 4/2016 |

OTHER PUBLICATIONS

International Search Report and Written Opinion prepared by the Japanese Patent Office dated Feb. 6, 2019, for International Application No. PCT/JP2018/044233.

*Primary Examiner* — Michael T Tran
(74) *Attorney, Agent, or Firm* — . Sheridan Ross P.C.

(57) ABSTRACT

A disclosed semiconductor device includes a memory cell with a first terminal, a second terminal, a memory element having a first resistance state and a second resistance state, and a nonlinear element, and a drive controller that performs a first operation that allows the memory element to be in the first resistance state, a second operation that allows the memory element to be in the second resistance state, a third operation in which the voltage of the first and second terminals is caused to be different from each other and a value of electric current flowing between the first terminal and the second terminal is caused to be limited to a first current value to determine the resistance state, and a fourth operation in which the current value is caused to be limited to a second current value. The drive controller performs the (Continued)

fourth operation after at least one of the first to third operations.

20 Claims, 20 Drawing Sheets

(58) Field of Classification Search
USPC .................................................. 365/148, 158
See application file for complete search history.

(56) References Cited

U.S. PATENT DOCUMENTS

| | | | |
|---|---|---|---|
| 2010/0103725 A1* | 4/2010 | Kim | G11C 13/004 365/163 |
| 2010/0165716 A1 | 7/2010 | Kau et al. | |
| 2010/0200830 A1* | 8/2010 | Liu | H01L 21/31116 257/4 |
| 2011/0002156 A1* | 1/2011 | Murooka | G11C 13/0007 365/148 |
| 2013/0121056 A1* | 5/2013 | Liu | H01L 27/228 365/148 |
| 2014/0050011 A1* | 2/2014 | Sone | G11C 13/0097 365/148 |
| 2014/0063906 A1* | 3/2014 | Minemura | G11C 13/0007 365/148 |
| 2014/0070344 A1* | 3/2014 | Khalili Amiri | G11C 11/161 257/421 |
| 2014/0227853 A1* | 8/2014 | Matamis | H01L 45/145 438/382 |
| 2014/0321194 A1 | 10/2014 | Sonehara | |
| 2015/0129829 A1* | 5/2015 | Kumar | G11C 13/003 257/5 |
| 2015/0131370 A1* | 5/2015 | Zhou | G11C 11/1675 365/158 |
| 2016/0043137 A1* | 2/2016 | Lu | G11C 11/1659 365/148 |
| 2016/0078935 A1 | 3/2016 | Zaitsu | |
| 2016/0180908 A1* | 6/2016 | Zhou | G11C 11/1677 365/156 |
| 2016/0276009 A1* | 9/2016 | Lee | G11C 29/021 |
| 2019/0146912 A1* | 5/2019 | Frolikov | G06F 3/061 711/103 |
| 2021/0183448 A1* | 6/2021 | Shin | G11C 16/12 |
| 2021/0191654 A1* | 6/2021 | Choi | G06F 3/0604 |
| 2021/0193229 A1* | 6/2021 | Liikanen | G11C 16/3459 |
| 2021/0241827 A1* | 8/2021 | Kowles | G11C 16/3418 |
| 2021/0249080 A1* | 8/2021 | Wang | G06F 11/1012 |
| 2021/0257038 A1* | 8/2021 | Hwang | G11C 16/3404 |
| 2021/0264968 A1* | 8/2021 | Kim | G11C 11/4099 |
| 2021/0264993 A1* | 8/2021 | Kim | G11C 16/10 |

* cited by examiner

SEMICONDUCTOR DEVICE

CROSS REFERENCE TO RELATED APPLICATIONS

This application is a national stage application under 35 U.S.C. 371 and claims the benefit of PCT Application No. PCT/JP2018/044233 having an international filing date of 30 Nov. 2018, which designated the United States, which PCT application claimed the benefit of Japanese Patent Application No. 2017-236830 filed 11 Dec. 2017, the entire disclosures of each of which are incorporated herein by reference.

TECHNICAL FIELD

The present disclosure relates to a semiconductor device that stores data.

BACKGROUND ART

In recent years, a cross-point type memory that is able to realize a large storage capacity has attracted attention in semiconductor memory devices. In this memory, for example, a memory cell includes a resistance variable memory element and a selection element having nonlinear electric characteristics. For example, PTLs 1 and 2 disclose a semiconductor memory device in which an ovonic threshold switch (OTS) including a chalcogenide material is used as a selection element.

CITATION LIST

Patent Literature

PTL 1: Japanese Unexamined Patent Application Publication No. 2006-86526
PTL 2: Japanese Unexamined Patent Application Publication No. 2010-157316

SUMMARY OF THE INVENTION

Incidentally, in an electronic device, a stable operation is generally desired, and a stable operation is also expected in a semiconductor device.

It is desirable to provide a semiconductor device that is able to achieve a stable operation.

A semiconductor device according to an embodiment of the present disclosure includes a memory cell and a drive controller. The memory cell includes a first terminal, a second terminal, a memory element configured to take a first resistance state and a second resistance state, and a nonlinear element configured to be in an on-state when a voltage difference between both ends is larger than a predetermined voltage difference. The memory element and the nonlinear element are provided on a path between the first terminal and the second terminal. The drive controller performs a first operation in which a first voltage of the first terminal is caused to be higher than a second voltage of the second terminal to allow a resistance state of the memory element to be in the first resistance state, a second operation in which the first voltage is caused to be lower than the second voltage to allow the resistance state of the memory element to be in the second resistance state, a third operation in which the first voltage and the second voltage are caused to be different from each other and a current value of electric current flowing between the first terminal and the second terminal is caused to be limited to lower than or equal to a first current value to determine the resistance state of the memory element, and a fourth operation in which the first voltage and the second voltage are caused to be different from each other and the current value is caused to be limited to lower than or equal to a second current value. The drive controller performs the fourth operation after at least one of the first operation, the second operation, or the third operation.

A semiconductor device according to an embodiment of the present disclosure includes a memory element and a nonlinear element between a first terminal and a second terminal between the memory cell. Further, performed in the semiconductor device are a first operation in which a first voltage of the first terminal is caused to be higher than a second voltage of the second terminal to allow a resistance state of the memory element to be in the first resistance state, a second operation in which the first voltage is caused to be lower than the second voltage to allow the resistance state of the memory element to be in the second resistance state, a third operation in which the first voltage and the second voltage are caused to be different from each other and a current value of electric current flowing between the first terminal and the second terminal is caused to be limited to lower than or equal to a first current value to determine the resistance state of the memory element, and a fourth operation in which the first voltage and the second voltage are caused to be different from each other and the current value is caused to be limited to lower than or equal to a second current value. The fourth operation is performed after at least one of the first operation, the second operation, or the third operation.

According to a semiconductor device in an embodiment of the present disclosure, the fourth operation is performed after at least one of the first operation, the second operation, or the third operation; therefore, it is possible to achieve a stable operation. It is to be noted that the effects described above are not necessarily limitative, and there may be achieved any one of the effects described in this specification.

MODES FOR CARRYING OUT THE INVENTION

In the following, some embodiments of the present disclosure are described in detail with reference to the drawings.

Embodiments

CONFIGURATION EXAMPLES

Figure 1:
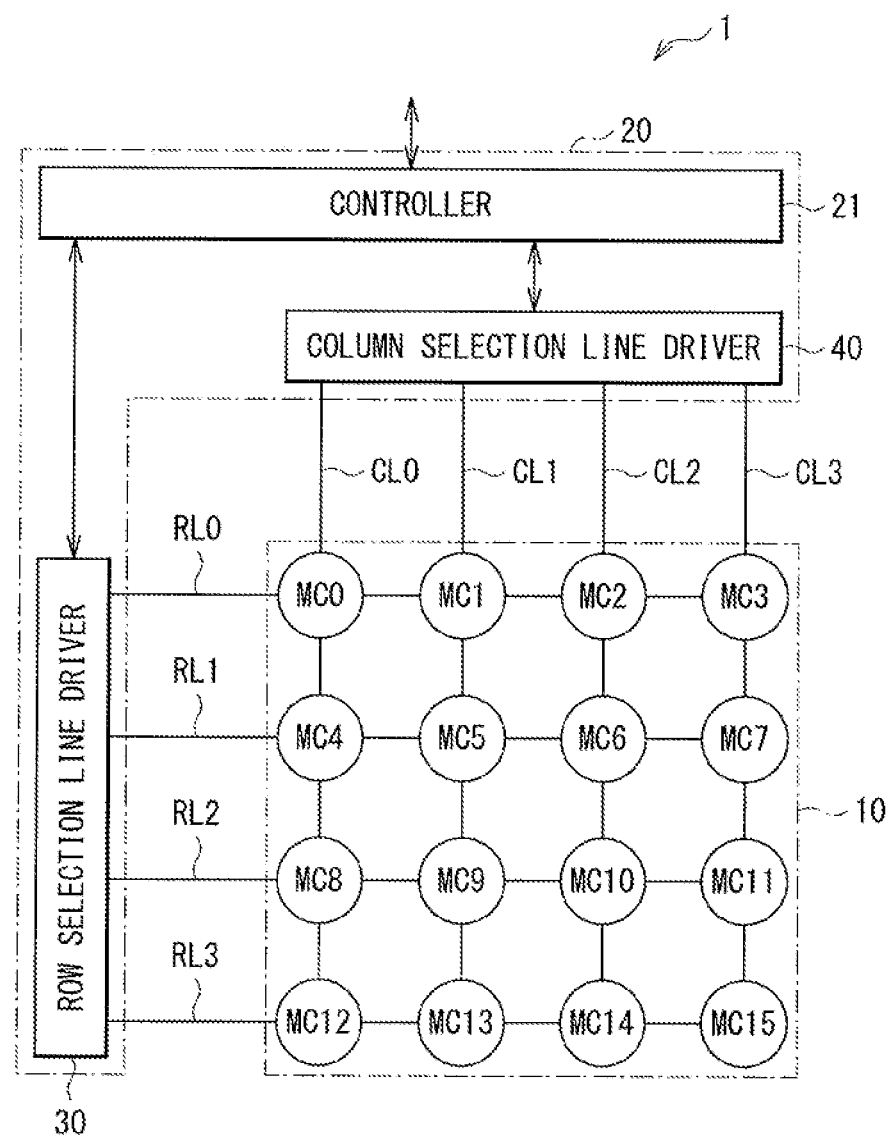
FIG. 1 is a block diagram illustrating a configuration example of a semiconductor device according to an embodiment of the present disclosure.

FIG. 1 illustrates a configuration example of a semiconductor device (semiconductor device 1) according to an embodiment. The semiconductor device 1 is a non-volatile semiconductor memory device that stores data using a resistance-variable memory element. The semiconductor device 1 includes a memory cell array 10 and a drive controller 20.

The memory cell array 10 is a so-called cross-point type memory cell array. The memory cell array 10 has a plurality of row selection lines RL (four row selection lines RL0 to RL3 in this example), a plurality of column selection lines CL (four column selection lines CL0 to CL3 in this example), and a plurality of memory cells MC (16 memory cells MC0 to MC15 in this example). The row selection lines RL0 to RL3 are selection lines extending in a lateral direction FIG. 1, and one ends of the respective row selection lines RL0 to R13 are coupled to the drive controller 20. The column selection lines CL0 to CL3 are selection lines extending in a vertical direction in FIG. 1, and one ends of the respective column selection hues CL0 to CL3 are coupled to the drive controller 20. In FIG. 1, the memory cells MC0 to MC15 are provided correspondingly to 16 intersections between the row selection lines RL0 to RL3 and the column selection lines CL0 to CL3.

It is to be noted that, in this example, 16 (4×4) memory cells MC are formed by providing four row selection lines RL0 to RL3 and four column selection lines CL0 to CL3, but the present disclosure is not limited thereto. For example, by providing M-number of row selection lines RL and N-number of column selection lines CL, it is possible to form M×N-number of memory cells MC.

Figure 2:
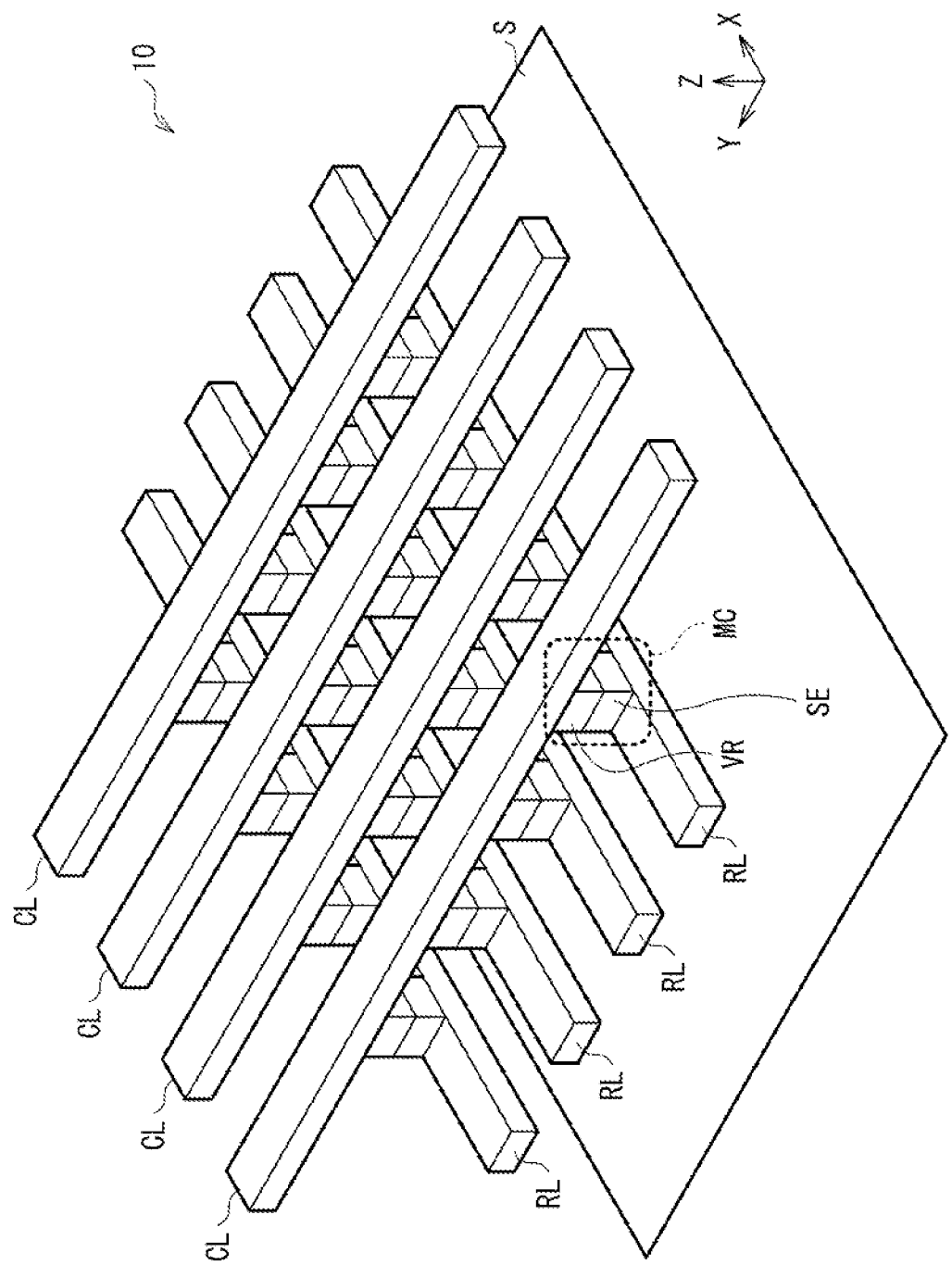
FIG. 2 is a perspective view illustrating a configuration example of a memory cell array illustrated in FIG. 1.

FIG. 2 illustrates a configuration example of the memory cell army 10. The row selection lines RL0 to RL3 are formed so as to extend in an X-direction in an X-Y plane parallel to a substrate plane S of the semiconductor. The column selection lines CL0 to CL3 are formed so as to extend in a Y-direction in the X-Y plane. The row selection lines RL0 to RL3 are formed in the same layer with respect to each other, and, above the row selection lines RL0 to RL3, the column selection lines CD0 to CL3 are formed in the same layer with respect to each other. There are 16 (4×4) memory cells MC (MC0 to MC15) formed in a layer between the layer in which the four row selection lines RL0 to RL3 are formed and the layer in which the four column selection lines CL0 to CL3 are formed.

It is to be noted that the memory cell array 10 is not limited to this configuration. For example, another plurality of row selection lines RL may be formed in a layer above the layer in which the plurality of column selection lines CL is formed and other memory cells MC may be formed in a layer between those layers. In this manner, by forming the memory cells MC over the plurality of layers, it is possible to increase the storage capacity.

Figure 3:
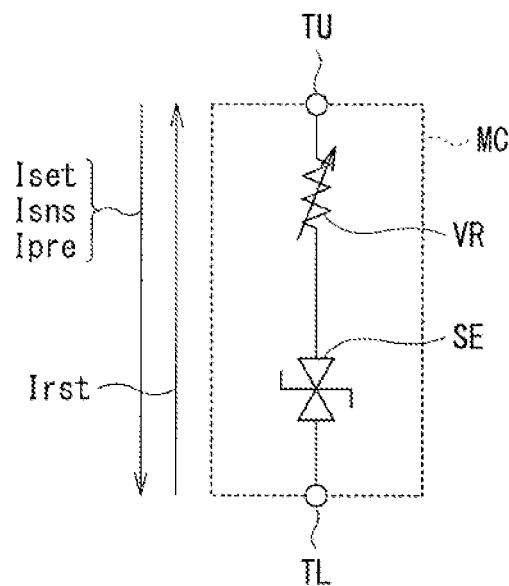
FIG. 3 is a circuit diagram illustrating a configuration example of a memory cell illustrated in FIG. 1.

FIG. 3 illustrates a configuration example of the memory cell MC. The memory cell MC includes a memory element VR and a selection element SE.

The memory element VR is a resistance-variable memory element whose resistance state RS changes reversibly in accordance to polarities of a voltage difference of voltages applied between both ends. In other words, the resistance state RS of the memory element VR reversibly changes in accordance with a direction of electric current flowing between the both ends. One end of the memory element YR is coupled to a terminal TU of the memory cell MC and the other end is coupled to one end of the selection element SE. The terminal TU is coupled to a column selection line CL formed above the layer in which the memory cell MC is formed, as illustrated in FIG. 2.

Figure 4:
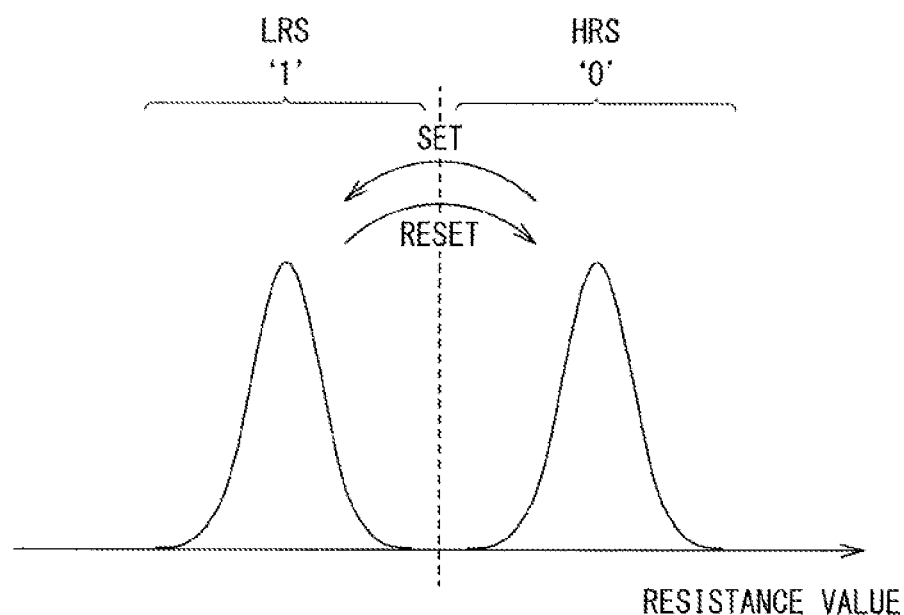
FIG. 4 is a characteristic diagram illustrating a characteristic example of a memory element illustrated in FIG. 3.

FIG. 4 schematically illustrates resistance value distribution of memory element VR. The memory element VR may have two identifiable resistance states RS (a high resistance state HRS and a low resistance state LRS). In this example, the high resistance state HRS is associated with data "0" and the low resistance state LRS is associated with data "1", for example. That is, the memory element VR functions as a memory element for storing one-bit data. Hereinafter, changing from the high resistance state HRS to the low resistance state LRS is referred to as "set", and changing from the low resistance state LRS to the high resistance state HRS is referred to as "reset".

As the memory element VR, it is possible to use, for example, a memory element applied to PCRAM (Phase Change Random Access Memory), a memory element applied to ReRAM (Resistive Random Access Memory) using an oxide such as tantalum oxide (TaOx), hafnium oxide (HfOx), or titanium oxide (TiOx), a memory element applied to MRAM (Magnetoresistive Random Access Memory), a memory element applied to STT-MRAM (Spin Transfer Torque Magnetoresistive Random Access Memory), or a memory element applied to ReRAM using a carbon material such as carbon nanotube or graphene.

The selection element SE (FIG. 3) is a nonlinear element having nonlinear electric characteristics. Specifically, the selection element SE is in a conductive state (on-state) when an absolute value of voltage difference of a voltage applied between both ends is larger than a predetermined voltage difference (threshold voltage Vth), and is in a non-conductive state (off-State) when an absolute value of the voltage difference is smaller than the predetermined voltage difference. One end of the selection element SE is coupled to the other end of the memory element VR, and the other end of the selection element SE is coupled to a TL terminal of the memory cell MC. The terminal TL is coupled to a row selection line RL formed below the layer on which the memory cell MC is formed, as illustrated in FIG. 2.

The selection element SE includes, for example, a material containing a chalcogen element. Specifically, the selection element SE includes, for example, a material containing at least one chalcogen element selected from sulfur (S), selenium (Se), or tellurium (Te). Further, the selection element SE includes, for example, a material containing at least one of boron (B) or carbon (C), at least one of aluminum (Al), gallium (Ga), or indium (In), and at least one of phosphorus (P) or arsenic (As). The selection element SE may include one layer or may include a plurality of stacked layers. As described above, the selection element SE includes a material containing chalcogen element; accordingly, when the absolute value of the voltage difference of the voltage applied between the both ends is larger than the predetermined voltage difference (threshold voltage Vth), it is possible to rapidly increase the electric current.

The drive controller 20 illustrated in FIG. 1 writes data to the memory cell array 10 on the basis of a write command and write data supplied from the outside, and reads data from the memory cell array 10 on the basis of a read command supplied from the outside. The drive controller 20 writes data to the memory cell MC by performing a set operation OPset or a reset operation OPrst. The drive controller 20 reads data stored in the memory cell MC by performing a sense operation OPsns. Further, the drive controller 20 performs a preparation operation OPpre, thereby preparing to write data to the memory cell MC after the preparation operation OPpre or preparing to read data from the memory cell MC next.

Figure 5A:
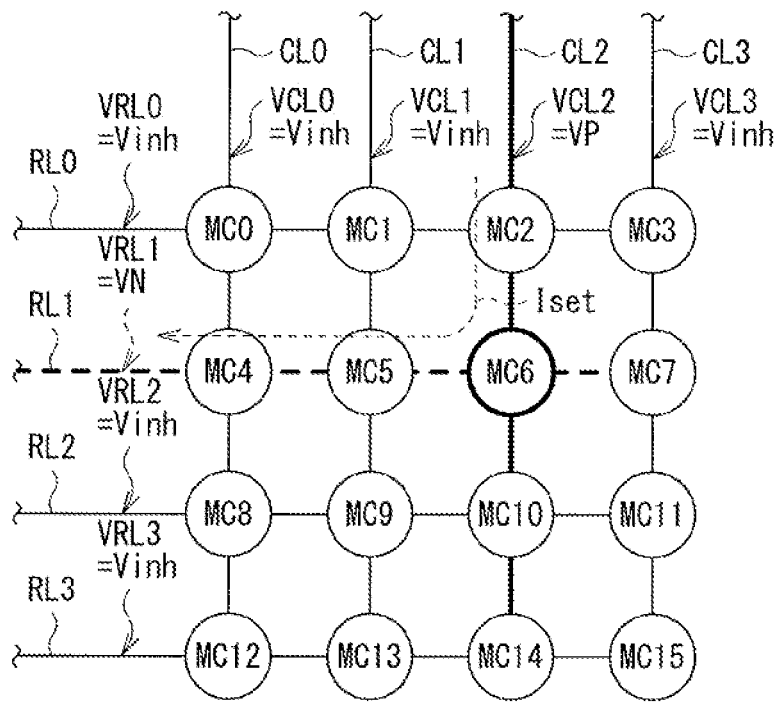
FIG. 5A is an explanatory diagram illustrating an example of a set operation in the semiconductor device illustrated in FIG. 1.
Figure 5B:
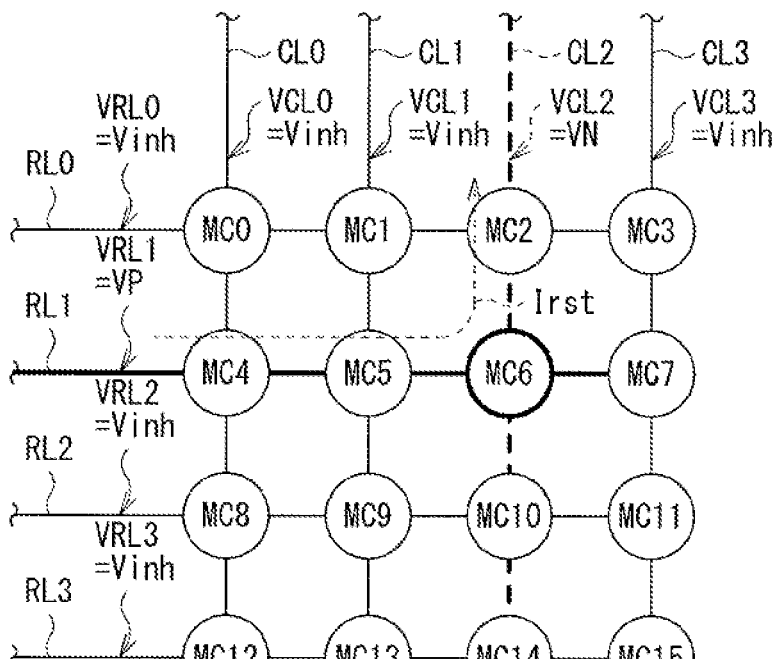
FIG. 5B is an explanatory diagram illustrating an example of a reset operation in the semiconductor device illustrated in FIG. 1.
Figure 5C:
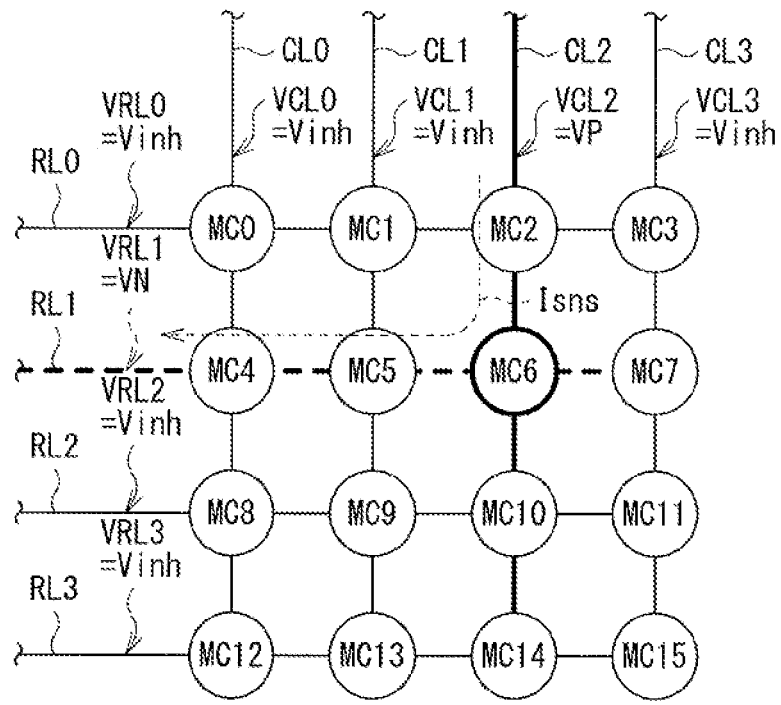
FIG. 5C is an explanatory diagram illustrating an example of a sense operation in the semiconductor device illustrated in FIG. 1.
Figure 5D:
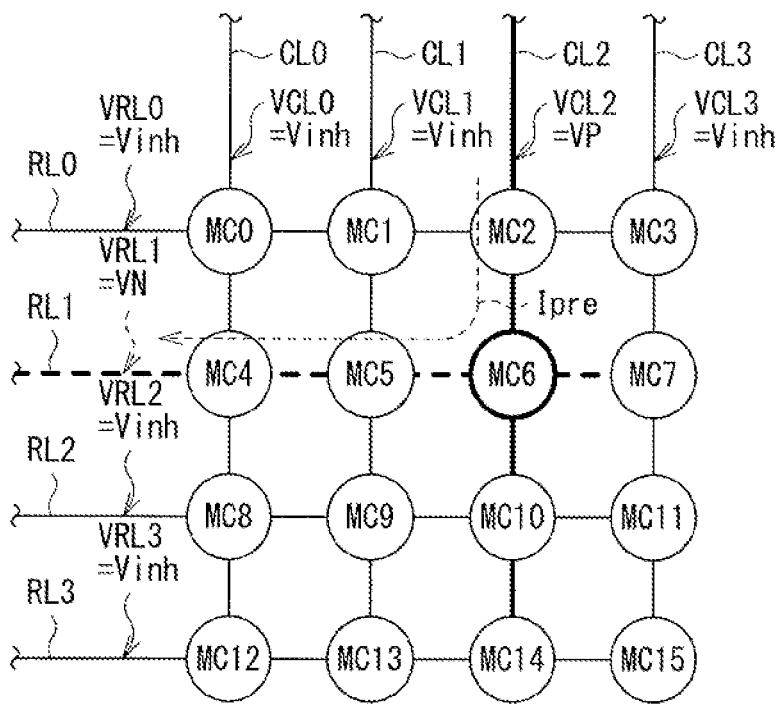
FIG. 5D is an explanatory diagram illustrating an example of a preparation operation in the semiconductor device illustrated in FIG. 1.

FIG. 5A illustrates an operation example of the set operation OPset, FIG. 5B illustrates an operation example of the reset operation OPrst, FIG. 5C illustrates an operation example of the sense operation OPsns, and FIG. 5D illustrates an operation example of the preparation operation OPpre. In FIGS. 5A to 5D, a memory cell MC indicated by a thick line (the memory cell MC6 in this example) indicates a memory cell MC to be subjected to operation.

As illustrated in FIG. 5A, in a case where the set operation OPset is performed on a certain memory cell MC (the memory cell MC6 in this example) out of the memory cells MC0 to MC15, the drive controller 20 applies a selection voltage VP (e.g., 7 V) to a column selection line CL (the column selection line CL2 in this example) related to the memory cell MC and also applies a selection voltage VN (e.g., 0 V) to a row selection line RL (the row selection line RL1 in this example) related to the memory cell MC, to thereby select the memory cell MC. In the selected memory cell MC, as illustrated in FIG. 3, the voltage at the terminal TU is higher than the voltage at the terminal TL, the selection element SE is in the on-state, and a set current Iset flows from the terminal TU to the terminal TL. A current value of the set current Iset is limited by a current limitation circuit 32 (to be described below) of a row selection line driver 30 (to be described below) to lower than or equal to a predetermined current value Icmpset (100 uA in this example). This causes the resistance state RS of the memory element VR to change from the high resistance state HRS to the low resistance state LRS and the memory element VR is set.

Further, as illustrated in FIG. 5B, in a case where the reset operation OPrst is performed on a certain memory cell MC (the memory cell MC6 in this example) out of the memory cells MC0 to MC15, the selection voltage VP (e.g., 7 V) is applied to the row selection line RL (the row selection line RL1 in this example) related to the memory cell MC and the selection voltage VN 0 V) is applied to the column selection line CL (the column selection line CL2 in this example) related to the memory cell MC, thereby the memory cell MC is selected. In the selected memory cell MC, as illustrated in FIG. 3, the voltage at the terminal TL is higher than the voltage at the terminal TU, the selection element SE is in the on-state, and a reset current Irst flows from the terminal TL to the terminal TU. This causes the resistance state RS of the memory element VR to change from the low resistance state LRS to the high resistance state HRS and the memory element VR is reset.

Further, as illustrated in FIG. 5C, in a case where the sense operation OPsns is performed on a certain memory cell MC (the memory cell MC6 in this example) out of the memory cells MC0 to MCl5, the drive controller 20 applies the selection voltage VP (e.g., 7 V) to a column selection line CL (the column selection line CL2 in this example) related to the memory cell MC and also applies the selection voltage VN (e.g., 0 V) to a row selection line RL (the row selection line RL1 in this example) related to the memory cell MC, to thereby select the memory cell MC. In the selected memory cell MC, as illustrated in FIG. 3, the voltage at the terminal TU is higher than the voltage at the terminal TL, the selection element SE is in the on-state, and a sense current Isns flows from the terminal TU to the terminal TL. A current value of the sense current Isis is limited by the current limitation circuit 32 (to be described below) of the row selection line driver 30 (to be described below) to lower than or equal to a predetermined current value Icmpsns (5 uA in this example). Then, a sense amplifier 34 (to be described below) detects a voltage generated in the memory cell MC to determine the resistance state RS of the memory element VR. That is, in the above explanation, the selection voltage VN (e.g., 0 V) is applied to the row selection line RL of the selected memory=cell but in reality, since the impedance of the row selection line driver 30 seen from the row selection line RL increases due to the current limitation circuit 32 of the row selection line driver 30 limiting the current value of the sense current Isns, the voltage of the row selection line RL deviates from the selection voltage VN (e.g., 0 V). Accordingly, the sense amplifier 34 determines the resistance state RS of the memory element VR by detecting the voltage of the row selection line RL. In the sense operation OPsns, the memory element VR is not set because the current value of the sense current Isns is limited to lower than the current value of the set current Iset. As a result, the resistance state RS of the memory element VR is maintained in the sense operation OPsns.

Further, as illustrated in FIG. 5D, in a case where the preparation operation OPpre is performed on a certain memory cell MC (the memory cell MC6 in this example) out of the memory cells MC0 to MC15, the drive controller 20 applies the selection voltage VP (e.g., 7 V) to a column selection line CL (the column selection line CL2 in this example) related to the memory cell MC and also applies the selection voltage VN (e.g., 0 V) to a row selection line RL (the row selection line RL1 in this example) related to the memory cell MC, to thereby select the memory cell MC. In the selected memory cell MC, as illustrated in FIG. 3, the voltage at the terminal TU is higher than the voltage at the terminal TL, the selection element SE is in the on-state, and a preparation current Ipre flows from the terminal TU to the terminal TL. A current value of the preparation current Ipre is limited by the current limitation circuit 32 (to be described below) of the row selection line driver 30 (to be described below) to lower than or equal to a predetermined current value Icmppre. It is possible to set the predetermined current value Icmppre to a value lower than or equal to the predetermined current value Icmpsns (5 uA in this example) in the sense operation OPsns, for example. As a result, the resistance state RS of the memory element VR is maintained in the preparation operation OPpre. As will be described later, by performing the preparation operation OPpre, it is possible to suppress variation in the threshold voltage Vth of the selection element SE in the set operation OPset after the preparation operation OPpre, the reset operation OPrst after the preparation operation OPpre, or the sense operation OPsns after the preparation operation OPpre.

Further, as illustrated in FIGS. 5A to 5D, in a case where any one of the set operation OPset, the reset operation OPrst, the sense operation OPsns, and the preparation operation OPpre is performed with respect to a certain memory cell MC (the memory cell MC6 in this example) out of the memory cells MC0 to MC15, the drive controller 20 applies a non-selection voltage Vinh (e.g., 3.5 V) to the row selection line RL to which the selection voltages VP and VN are not applied, and applies the nonselection voltage Vinh (e.g., 3.5 V) to the column selection line CL to which the selection voltages VP and VN are not applied. Thus, at memory cells MC other than the selected memory cell MC, voltages at the terminals TU and TL are equal to each other, the selection elements SE are in the off-state, and little electric current flows. As a result, resistance states RS of the memory elements VR are maintained in those memory cells MC.

The drive controller 20 includes a controller 21, the row selection line driver 30, and a column selection line driver 40. The drive controller 20 is formed, for example, on a semiconductor substrate below the memory cell array 10. It is to be noted that the present disclosure is not limited thereto, and the drive controller 20 may also be formed over the semiconductor substrate, for example, at an outer area of the memory cell array 10 or in an upper layer of memory cell array 10.

The controller 21 controls operation of the row selection line driver 30 and the column selection line driver 40 on the basis of a write command, write data, and a read command supplied from the outside. Specifically, the controller 21 controls operation of the row selection line driver 30 and the column selection line driver 40 so that the row selection line driver 30 and the column selection line driver 40 perform the set operation OPset or the reset operation OPrst on the basis of the write command and the write data supplied from the outside. Further, the controller 21 controls operation of the row selection line driver 30 and the column selection line driver 40 so that the row selection line driver 30 and the column selection line driver 40 perform the sense operation OPsns on the basis of the read command supplied from the outside. Further, the controller 21 controls operation of the row selection line driver 30 and the column selection line driver 40 such that the row selection line driver 30 and the column selection line driver 40 perform the preparation operation OPpre after the set operation OPset, the reset operation OPrst, and the sense operation OPsns. The controller 21 includes, for example, a micro-controller.

The row selection line driver 30 selectively applies a voltage to the row selection lines RL0 to RL3 on the basis of an instruction from the controller 21, and reads data, on the basis of the voltage of the row selection lines RL0 to RL3. The column selection line driver 40 selectively applies a voltage to the column selection lines CL0 to CL3 on the basis of an instruction from the controller 21. The row selection line driver 30 and the column selection line driver 40 are described in detail below.

Figure 6:
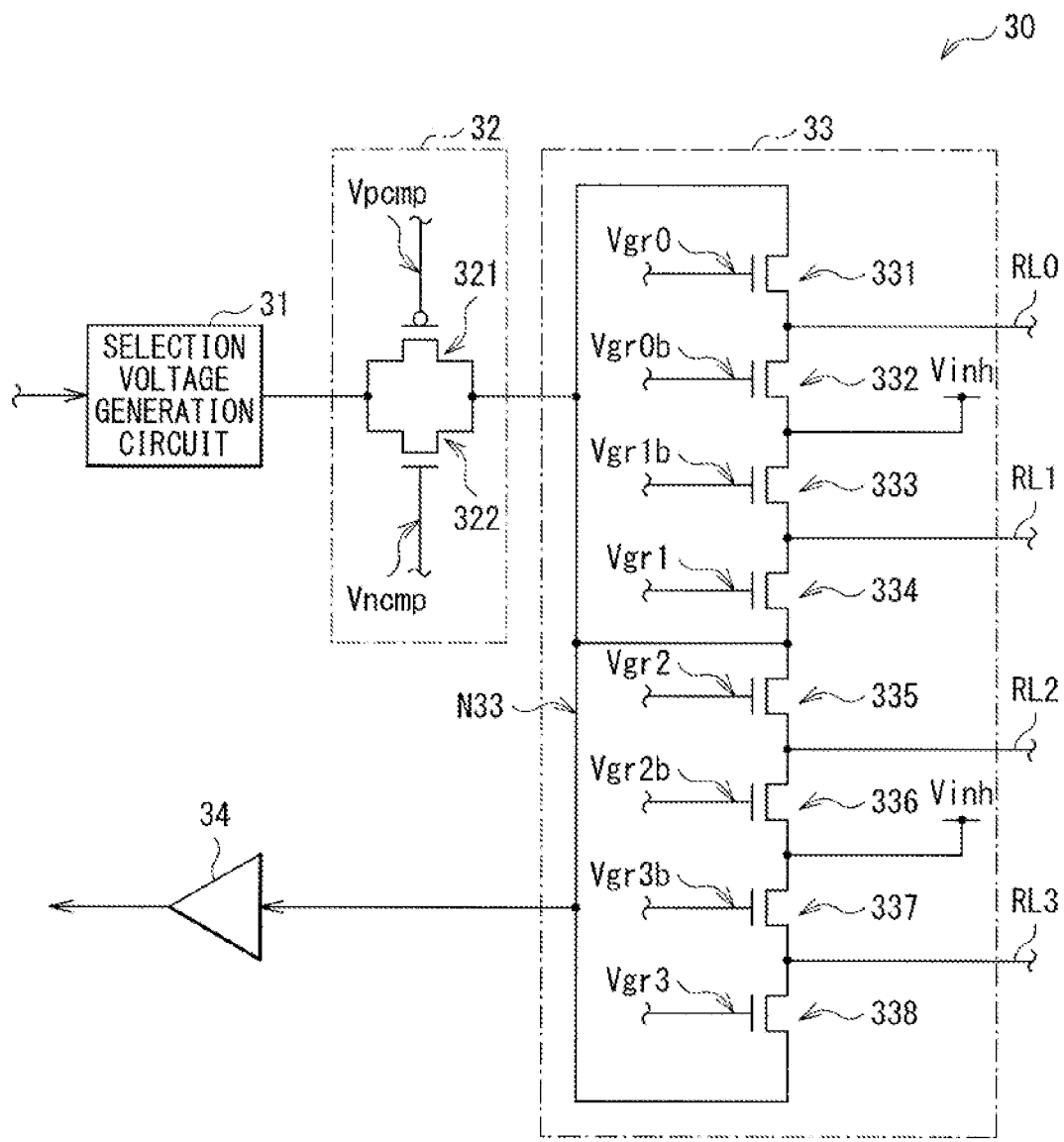
FIG. 6 is a circuit diagram illustrating, a configuration example of a row selection line driver illustrated in FIG. 1.

FIG. 6 illustrates a configuration example of the row selection line driver 30. The row selection line driver 30 includes a selection voltage generation circuit 31, the current limitation (compliance) circuit 32, a decoder 33, and the sense amplifier 34. The row selection line driver 30 also includes, although not illustrated, an inverter that generates, on the basis of logical signals Vgr0 to Vgr3 supplied from the controller 21, logical signals Vgr0b to Vgr3b, which are inversion signals of the logical signals Vgr0 to Vgr3.

The selection voltage generation circuit 31 outputs either the selection voltage VP or the selection voltage VN on the basis of a control signal supplied from the controller 21. More specifically, the selection voltage generation circuit 31 outputs the selection voltage VN (e.g., 0 V) in the set operation OPset, the sense operation OPsns, and the preparation operation OPpre, and outputs the selection voltage VP (e.g., 7 V) in the reset operation OPrst, on the basis of the control signal supplied from the controller 21.

The current limitation circuit 32 limits a current value of electric current flowing through the selected memory cell MC on the basis of voltages Vpcmp and Vncmp supplied from the controller 21. The current limitation circuit 32 includes transistors 321 and 322. The transistor 321 is a P-type MOS (Metal Oxide Semiconductor) transistor. A gate of the transistor 321 is supplied with the voltage Vpcmp, a source of the transistor 321 is coupled to a source of the transistor 322 and to the selection voltage generation circuit 31, and a drain of the transistor 321 is coupled to a drain of the transistor 322 and to a node N33 of the decoder 33. The transistor 322 is an N-type MOS transistor. A gate of the transistor 322 is supplied with the voltage Vncmp, the source of the transistor 322 is coupled to the source of the transistor 321 and to the selection voltage generation circuit 31, and a drain of the transistor 322 is coupled to the drain of the transistor 321 and to the node N33 of the decoder 33.

In a case where the selection voltage generation circuit 31 outputs the selection voltage VN (e.g., 0 V) in the set operation OPset, the current limitation circuit 32 limits the current value of the electric current flowing through the selected memory cell MC to lower than or equal to the predetermined current value Icmpset (e.g., 100 uA) on the basis of the voltage Vncmp, which is an analog voltage supplied from the controller 21. In a case where the selection voltage generation circuit 31 outputs the selection voltage VP (e.g., 7 V) in the reset operation OPrst, the current limitation circuit 32 operates so as not to limit the electric current on the basis of the low-level voltage Vpcmp supplied from the controller 21. Further, in a case where the selection voltage generation circuit 31 outputs the selection voltage VN (e.g., 0 V) in the sense operation OPsns, the current limitation circuit 32 limits the current value of the electric current flowing through the selected memory cell MC to lower than or equal to the predetermined current value Icmpsns (e.g., 5 uA) on the basis of the voltage Vncmp, which is an analog voltage supplied from the controller 21. Further, in a case where the selection voltage generation circuit 31 outputs the selection voltage VN (e.g., 0 V) in the preparation operation OPpre, the current limitation circuit 32 limits the current value of the electric current flowing through the selected memory cell MC to lower than or equal to the predetermined current value Icmppre on the basis of the voltage Vncmp, which is an analog voltage supplied from the controller 21. It is possible to set the predetermined current value Icmppre, for example, to a value lower than or equal to the predetermined current value Icmpsns (e.g. 5 uA) in the sense operation OPsns.

The decoder 33 selectively applies the selection voltage supplied from the selection voltage generation circuit 31 via the current limitation circuit 32 to the row selection lines RL0 to RL3 on the basis of the logical signals Vgr0 to Vgr3 supplied from the controller 21. The decoder 33 includes transistors 331 to 338. The transistors 331 to 338 are each an N-type MOS transistor. A gate of the transistor 331 is supplied with the logical signal Vgr0, a source of the transistor 331 is coupled to the node N33, and a drain of the transistor 331 is coupled to a drain of the transistor 332 and to the row selection line RL0. A gate of the transistor 332 is supplied with the logical signal Vgr0b, Which is an inversion signal of the logical signal Vgr0, a source of the transistor 332 is supplied with the non-selection voltage Vinh (e.g., 3.5 V), and the drain of the transistor 332 is coupled to the drain of the transistor 331 and to the row selection line RL0. A gate of the transistor 333 is supplied with the logical signal Vgr1b, which is an inversion signal of the logical signal Vgr1, a source of the transistor 333 is supplied with the non-selection voltage Vinh (e.g., 3.5 V), and a drain of the transistor 333 is coupled to a drain of the transistor 334 and to the row selection line RL4. A gate of the transistor 334 is supplied with the logical signal Vgr1, a source of the transistor 334 is coupled to the node N33, and the drain of the transistor 334 is coupled to the drain of the transistor 333 and to the row selection line RL1. A gate of the transistor 335 is supplied with the logical signal Vgr2, a source of the transistor 335 is coupled to the node N33, and a drain of the transistor 335 is coupled to a drain of the transistor 336 and to the row selection line RL2. A gate of the transistor 336 is supplied with the logical signal Vgr2b, which is an inversion signal of the logical signal Vgr2, a source of the transistor 336 is supplied with the non-selection voltage Vinh (e.g., 3.5 V), and the drain of the transistor 336 is coupled to the drain of the transistor 335 and to the row selection line RL2. A gate of the transistor 337 is supplied with the logical signal Vgr3b, which is an inversion signal of the logical signal Vgr3, a source of the transistor 337 is supplied with the non-selection voltage Vinh (e.g., 3.5 V), and a drain of the transistor 337 is coupled to a drain of the transistor 338 and to the row selection line RL3. A gate of the transistor 338 is supplied with the logical signal Vgr3, a source of the transistor 338 is coupled to the node N33, and the drain of the transistor 338 is coupled to the drain of the transistor 337 and to the row selection line RL3.

With such a configuration, the decoder 33 turns on one of the transistors 331, 334, 335, and 338 on the basis of the logical signals Vgr0 to Vgr3 supplied from the controller 21. The decoder 33 turns on one of the transistors 331 and 33.2 and turns off the other, turns on one of the transistors 334 and 333 and turns off the other, truces on one of the transistors 335 and 336 and turns off the other, and turns on one of the transistors 338 and 337 and turns off the other. Thereby, the decoder 33 applies the selection voltage generated by the selection voltage generation circuit 31 to one of the row selection lines RL0 to RL3 and applies the non-selection voltages Vinh to the other row selection lines RL.

The sense amplifier 34 determines the resistance state RS of the selected memory cell MC on the basis of a voltage at the node N33 of the decoder 33 in the selection operation OPsns. Then, the sense amplifier 34 supplies the determination result of the resistance state RS to the controller 21.

Figure 7:
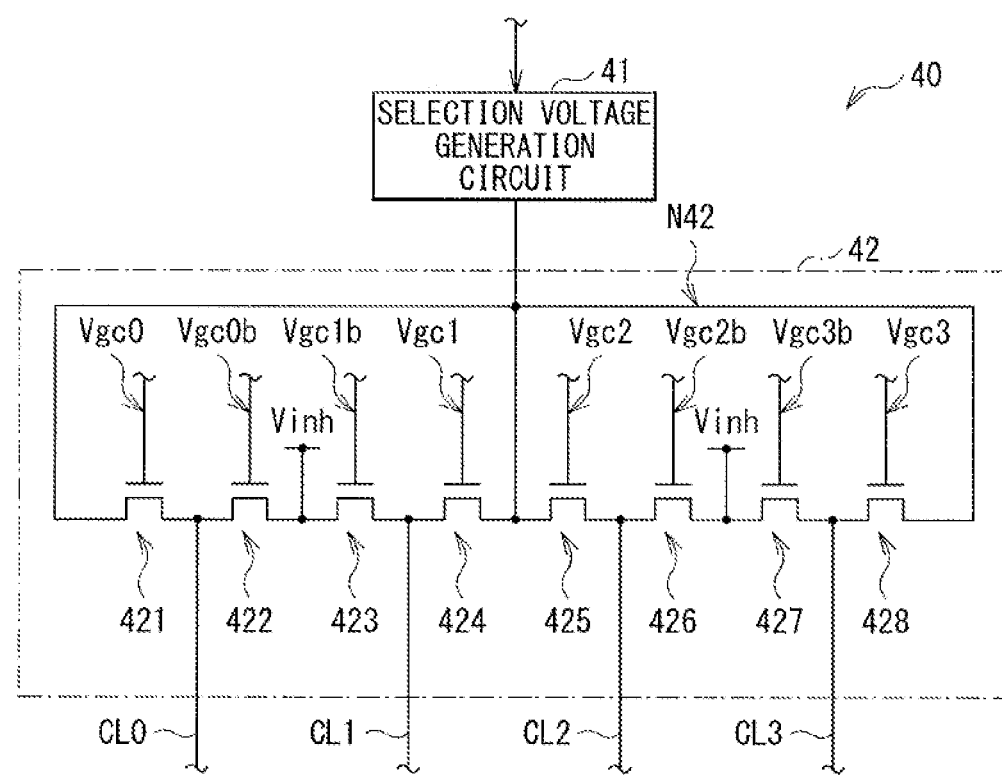
FIG. 7 is a circuit diagram illustrating a configuration example of a column selection line driver illustrated in FIG. 1.

FIG. 7 illustrates a configuration example of the column selection line driver 40. The column selection line driver 40 includes a selection voltage generation circuit 41 and a decoder 42. The column selection line driver 40 also includes, although not illustrated, an inverter that generates, on the basis of logical signals Vgc0 to Vgc3 supplied from the controller 21, logical signals Vgc0b to Vgc3b, which are inversion signals of the logical signals Vgc0 to Vgc3.

The selection voltage generation circuit 41 outputs either the selection voltage VP or the selection voltage VN on the basis of a control signal supplied from the controller 21. More specifically, the selection voltage generation circuit 41 outputs the selection voltage VP (e.g., 7 V) in the set operation OPset, the sense operation OPsns, and the preparation operation OPpre, and outputs the selection voltage VN (e.g., 0 V) in the reset operation OPrst, on the basis of the control signal supplied from the controller 21.

The decoder 42 selectively applies the selection voltage supplied from the selection voltage generation circuit 41 to the column selection lines CL0 to CL3 on the basis of the logical signals Vgc0 tip Vgc3 supplied form the controller 21. The decoder 42 includes transistors 421 to 428. The transistors 421 to 428 are each an N-type MOS transistor. A gate of the transistor 421 is supplied with the logical signal Vgc0, a source of the transistor 421 is coupled to a node N42, and a drain of the transistor 421 is coupled to a drain of the transistor 422 and to the column selection line CL0. A gate of the transistor 422 is supplied with the logical signal Vgc0b, which is an inversion signal of the logical signal Vgc0, a source of the transistor 422 is supplied with the non selection voltage Vinh (e.g., 3.5 V), and the drain of the transistor 422 is coupled to the drain of the transistor 421 and to the column selection line CL0. A gate of the transistor 423 is supplied with the logical signal Vgc1b, which is an inversion signal of the logical signal Vgc1, a source of the transistor 423 is supplied with the non-selection voltage Vinh e.g., 3.5 V), and a drain of the transistor 423 is coupled with a drain of the transistor 424 and to the column selection line CL1. A gate of the transistor 424 is supplied with the logical signal Vgc1, a source of the transistor 424 is coupled to the node N42, and the drain of the transistor 424 is coupled to the drain of the transistor 423 and to the column selection line CL1. A gate of the transistor 425 is supplied with the logical signal Vgc2, a source of the transistor 425 is coupled to the node N42, and a drain of the transistor 425 is coupled to a drain of the transistor 426 and to the column selection line CL2. A gate of the transistor 426 is supplied with the logical signal Vgc2b, which is an inversion signal of the logical signal Vgc2, a source of the transistor 426 is supplied with the non-selection voltage Vinh (e.g., 3.5 V), and the drain of the transistor 426 is coupled to the drain of the transistor 425 and to the column selection title CL2. A gate of the transistor 427 is supplied with the logical signal Vgc3b, which is an inversion signal of the logical signal Vgc3, a source of the transistor 427 is supplied with the non-selection voltage Vinh (e.g., 3.5 V), and a drain of the transistor 427 is coupled to a drain of the transistor 428 and to the column selection line CL3. A gate of the transistor 428 is supplied with the logical signal Vgc3, a source of the transistor 428 is coupled to the node N42, and the drain of the transistor 428 is coupled to the drain of the transistor 427 and to the column selection line CL3.

With such a configuration, the decoder 42 turns on one of the transistors 421, 424, 425, and 428 on the basis of the logical signals Vgc0 to Vgc3 supplied from the controller 21. The decoder 42 turns on one of the transistors 421 and 422 and turns off the other, turns on one of the transistors 424 and 423 and turns off the other, turns on one of the transistors 425 and 426 and turns off the other, and turns on one of the transistors 428 and 427 and turns off the other. Thereby, the decoder 42 applies the selection voltage generated by the selection voltage generation circuit 41 to one of the column selection lines CL0 to CL3, and applies the non-selection voltages Vinh to the other column selection lines CL.

Here, the memory element VR corresponds to a specific example of a "memory element" according to the present disclosure. The selection element SE corresponds to a specific example of a "nonlinear element" according to the present disclosure. The set operation OPset corresponds to a specific example of a. "first operation" according to the present disclosure. The reset operation OPrst corresponds to a specific example of a "second operation" according to the present disclosure. The sense operation OPsns corresponds to a specific example of a "third operation" according to the present disclosure. The preparation operation OPpre corresponds to a specific example of a "fourth operation" according to the present disclosure.

[Operations and Workings]

Next, operations and workings of the semiconductor device 1 according to the present embodiment will be described.

[Outline of Overall Operation]

First, referring to FIG. 1, an outline of overall operation of the semiconductor device 1 will be described. The controller 21 of the drive controller 20 controls operation of the row selection line driver 30 and the col in selection line driver 40 on the basis of a write command, write data, and a read command supplied from the outside. The row selection line driver 30 selectively applies a voltage to the row selection lines RL0 to RL3 on the basis of an instruction from the controller 21, and reads data on the basis of voltages of the row selection lines RL0 to RL3. The column selection line driver 40 selectively applies a voltage to the column selection hues CL0 to CL3 on the basis of an instruction from controller 21. In the memory cell array 10, for example, one memory cell MC is selected, data is written to the memory cell MC, or data is read from the memory cell MC.

[Detailed Operation]

The controller 21 of the drive controller 20 controls operation of the row selection line driver 30 and the column selection line driver 40 so that the row selection line driver 30 and the column selection line driver 40 perform the set operation OPset or the reset operation OPrst on the basis of a write command and write data supplied from the outside. Further, the controller 21 controls operation of the row selection line driver 30 and the column selection line driver 40 so that the row selection line driver 30 and the column selection line driver 40 perform the sense operation OPsns on the basis of a read command supplied from the outside. Further, the controller 21 controls operation of the row selection line driver 30 and the column selection line driver 40 such that the row selection line driver 30 and the column selection line driver 40 perform the preparation operation OPpre after the set operation OPset, the reset operation OPrst, and the sense operation OPsns.

Figure 8:
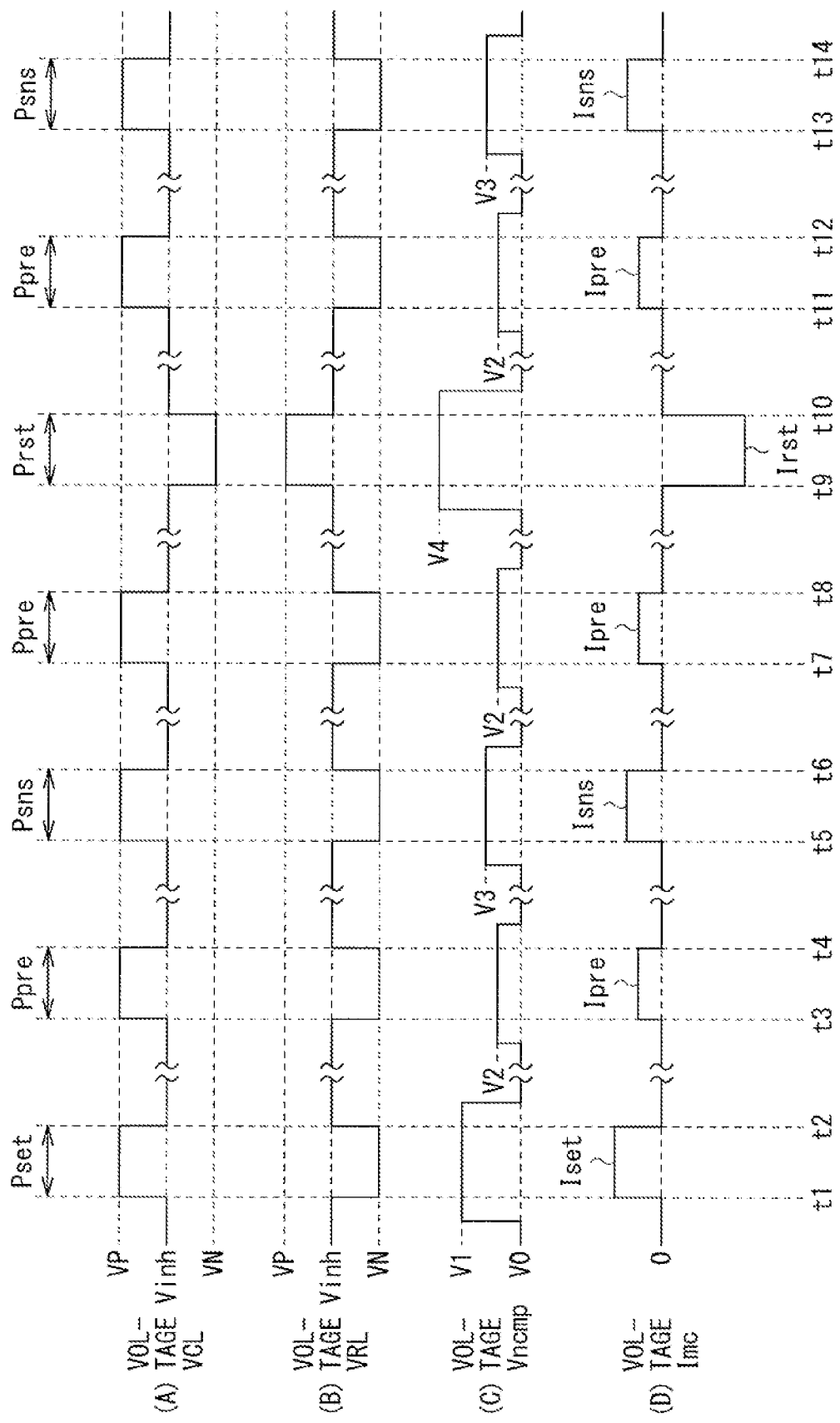
FIG. 8 is a timing diagram illustrating an operation example of the semiconductor device illustrated in FIG. 1.

FIG. 8 illustrates an operation example of the semiconductor device 1, where (A) illustrates a waveform of a voltage VCL in a column selection line CL related to the selected memory cell MC, (B) illustrates a waveform of a voltage VRL in a row selection line RL related to the selected memory cell MC, (C) illustrates a waveform of the voltage Vncmp to be supplied to the current limitation circuit 32, and (D) illustrates a waveform of an electric current fine flowing through the selected memory cell MC.

In this example, the semiconductor device 1 performs the set operation OPset, the preparation operation OPpre, the sense operation OPsns, the preparation operation OPpre, the reset operation OPrst, the preparation operation OPpre, and the sense operation OPsns on the selected memory cell MC in this order. Those operations will be described in detail below.

The semiconductor device 1 performs the set operation OPset during a period between timing t1 and t2 (set operation period Pset), Specifically, first, at a timing prior to timing t1, the controller 21 sets the voltage Vncmp to a voltage V1 (FIG. 8(C)). The current limitation circuit 32 thereby limits the current value of the electric current hue flowing through the memory cell MC to lower than or equal to the predetermined current value Icmpset (100 uA in this example). Thereafter, at timing t1, the column selection line driver 40 changes the voltage VCL in the column selection line CL related to the selected memory cell MC from the non-selection voltage Vinh to the selection voltage VP, and the row selection line driver 30 changes the voltage VRL in the row selection line RL related to the selected memory cell MC from the non-selection voltage Vinh to the selection voltage VN (FIG. 8(A) and (B)). Thus, in the selected memory cell MC, the set current Iset flows (FIG. 8(D)), and the resistance state RS of the memory element VR in the selected memory cell MC is set to the low resistance state LRS. Thereafter, at timing t2, the column selection line driver 40 changes the voltage VCL from the selection voltage VP to the non-selection voltage Vinh, and the row selection line driver 30 changes the voltage VRL from the selection voltage VN to the non-selection voltage Vinh (FIG. 8(A) and (B)). Further, at a timing after timing t2, the controller 21 sets the voltage Vncmp to a voltage V0 (FIG. $ (C)).

Next, the semiconductor device 1 performs the preparation operation OPpre during a period between timing t3 and timing t4 (preparation operation period Ppre). Specifically, first, at a timing prior to timing t3, the controller 21 sets the voltage Vncmp to a voltage V2 (FIG. 8(C)). The current limitation circuit 32 thereby limits the current value of the electric current Luc flowing through the memory cell MC to lower than or equal to the predetermined current value Icmppre. In this example, the predetermined current value Icmppre is set to a value lower than the predetermined current value Icmpsns (5 uA in this example) in the sense operation OPsns. Thereafter, at timing t3 the column selection line driver 40 changes the voltage VCL to the selection voltage VP, and the row selection line driver 30 changes the voltage VRL to the selection voltage VN (FIG. 8(A) and (B)). Thus, in the selected memory cell MC, the preparation current Ipre flows (FIG. 8(D)). Thereafter, at timing t4, the column selection line driver 40 changes the voltage VCL to the non-selection voltage Vinh, and the row selection line driver 30 changes the voltage VRL to the non-selection voltage Vinh (FIG. 8(A) and (B)). Further, at a timing after timing t4, the controller 21 sets the voltage Vncmp to the voltage V0 (FIG. 8(C)).

Next, the semiconductor device 1 performs the sense operation OPsns during a period between timing t5 and timing t6 (sense operation period Psns). Specifically, first, at a timing prior to timing 15, the controller 21 sets the voltage Vncmp to a voltage V3 (FIG. 8(C)). The current limitation circuit 32 thereby limits the current value of the electric current Inc flowing through the memory cell MC to the predetermined current value Icmpsns (5 uA in this example). Thereafter, at timing t5, the column selection line driver 40 changes the voltage VCL to the selection voltage VP, and the row selection line driver 30 changes the voltage VRL to the selection voltage VN (FIG. 8(A) and (B)). Thus, in the selected memory cell MC, the sense current Isns flows (FIG. 8(D)). Then, the sense amplifier 34 determines the resistance state RS of the memory element VR in the selected memory cell MC. In this example, in the period between timing t1 and timing t2, since the resistance state RS of the memory element VR is set to the low resistance state LRS, the sense amplifier 34 determines that the resistance state RS of the memory element VR is the low resistance state LRS. Thereafter, at timing t6, the column selection line driver 40 changes the voltage VCL to the non-selection voltage Vinh, and the row selection line driver 30 changes the voltage. VRL to the non-selection voltage Vinh (FIG. 8(A) and (B)). Further, at a timing after timing t6, the controller 21 sets the voltage Vncmp to the voltage V0 (FIG. 8(C)).

The semiconductor device 1 then performs the preparation operation OPpre during a period between timing t7 and timing t8 (preparation operation period Ppre). This operation is similar to the operation in the period between timing t3 and timing t4.

Next, the semiconductor device 1 performs the reset operation OPrst during a period between timing t9 and timing t10 (reset operation period Prst). Specifically, first, at a timing prior to timing t9, the controller 21 sets the voltage Vncmp to a voltage V4 (FIG. 8(C)). Thereafter, at timing t9, the column selection line driver 40 changes the Voltage VCL to the selection Voltage VN, and the row selection line driver 30 changes the voltage VRL to the selection voltage VP (FIG. 8(A) and (B)). Thus, in the selected memory cell MC, the reset current Irst flows (FIG. 8(P)), and the resistance state RS of the memory element VR in the selected memory cell MC is set to the high resistance state HRS. Thereafter, at timing t10, the column selection line driver 40 changes the voltage VCL to the non-selection voltage Vinh, and the row selection line driver 30 changes the voltage VRL to the non-selection voltage Vinh (FIG. 8(A) and (B)). Further, at a timing after timing t10, the controller 21 sets the voltage Vncmp to the voltage V0 (FIG. 8(C)).

The semiconductor device 1 then performs the preparation operation OPpre during a period between timing t11 and timing t12 (preparation operation period Ppre). This operation is similar to the operation in the period between timing t3 and timing t4.

The semiconductor device 1 then performs the sense operation OPsns during a period between timing t13 and timing t14 (sense operation period Psns). This operation is similar to the operation in the period between timing, t5 and timing t6. In this example, since the resistance state RS of the memory element YR is set to the high resistance state HRS during the period between timing t9 and timing t10, the sense amplifier 34 determines that the resistance state RS of the memory element VR is the high resistance state HRS.

Thus, in the semiconductor device 1, the preparation operation OPpre has been performed after the set operation OPset, the reset operation OPrst, and the sense operation OPsns. Thus, in the semiconductor device 1, it is possible to suppress the change in the threshold voltage Vth of the selection element SE in the set operation OPset after the preparation operation OPpre, in the reset operation OPrst after the preparation operation OPpre, or in the sense operation OPsns after the preparation operation OPpre, as described below, and as a result, it is possible to achieve a stable operation.

EXPERIMENTAL EXAMPLES

By configuring the selection element SE using a material containing a chalcogen element, when the absolute value of the voltage difference of the voltage applied between both ends is larger than the predetermined voltage difference (threshold voltage Vth), it is possible to rapidly increase the electric current. However, in this case, as will be described below, the threshold voltage Vth of the selection element SE may vary depending on the electric current that has flowed through the selection element SE in the immediately previous operation. Therefore, in the semiconductor device 1, by performing the preparation operation OPpre after the set operation OPset, the reset operation OPrst, and the sense operation OPsns, the possibility of a change in the threshold voltage Vth of the selection element SE is reduced. Hereinafter, effects of the present embodiment will be described with reference to several examples.

Experimental Example A

Figure 9:
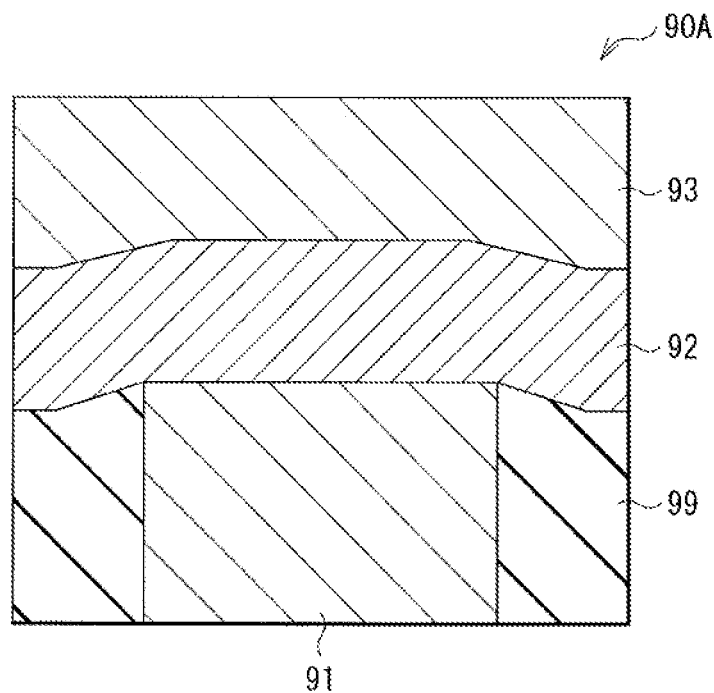
FIG. 9 is a cross-sectional view illustrating a configuration example of a test device that has been manufactured on an experimental basis.

FIG. 9 illustrates a configuration example of a test device 90A that has been manufactured on an experimental basis in an experimental example A, The test device 90A includes an electrode 91, an OTS layer 92, and an electrode 93. The electrode 91 is an electrode containing titanium nitride (TiN), which in this case is a 150 mm-diameter circular electrode. The electrode 91 is surrounded by an insulation film 99. The insulation film 99 includes tetraethyl orthosilicate (TEOS)-silicon oxide ($SiO_2$). The OTS layer 92 is formed over the electrode 91 and the insulation film 99. The OTS layer 92 includes a material containing a chalcogen element, and corresponds to the selection element SE (FIGS. 2 and 3) according to the present embodiment. The electrode 93 is formed over the OTS layer 92. The electrode 93 includes titanium (Ti)/aluminum (Al). That is, the electrode 93 is formed by stacking a titanium layer and an aluminum layer.

Figure 10:
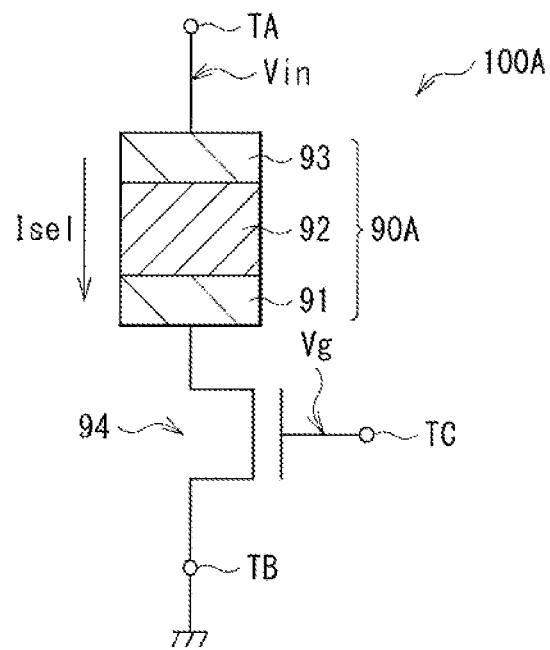
FIG. 10 is a circuit diagram illustrating a configuration example of a measurement circuit that measures characteristics of the test device.

FIG. 10 illustrates an example of a, measurement circuit 100A for measuring characteristics of the test device 90A. The electrode 93 of the test device 90A is coupled to a terminal TA. The electrode 91 of the test device 90A is coupled to a terminal 413 via, a transistor 94. The transistor 94 is an N-type MOS transistor, a drain of the transistor 94 is coupled to the electrode 91 of the test device 90A, a source of the transistor 94 is coupled to the terminal TB, and a gate of the transistor 94 is coupled to a terminal TC. The transistor 94 corresponds to the current limitation circuit 32 (FIG. 6) according to the present embodiment. A voltage Vin is applied to the terminal TA by a measurement device 101A (not illustrated), the terminal TB is grounded, and a voltage Vg is applied to the terminal TC by the measurement device 101A. Further, an electric current Isel flowing through the test device 90A is measured by the measurement device 101A.

Figure 11:
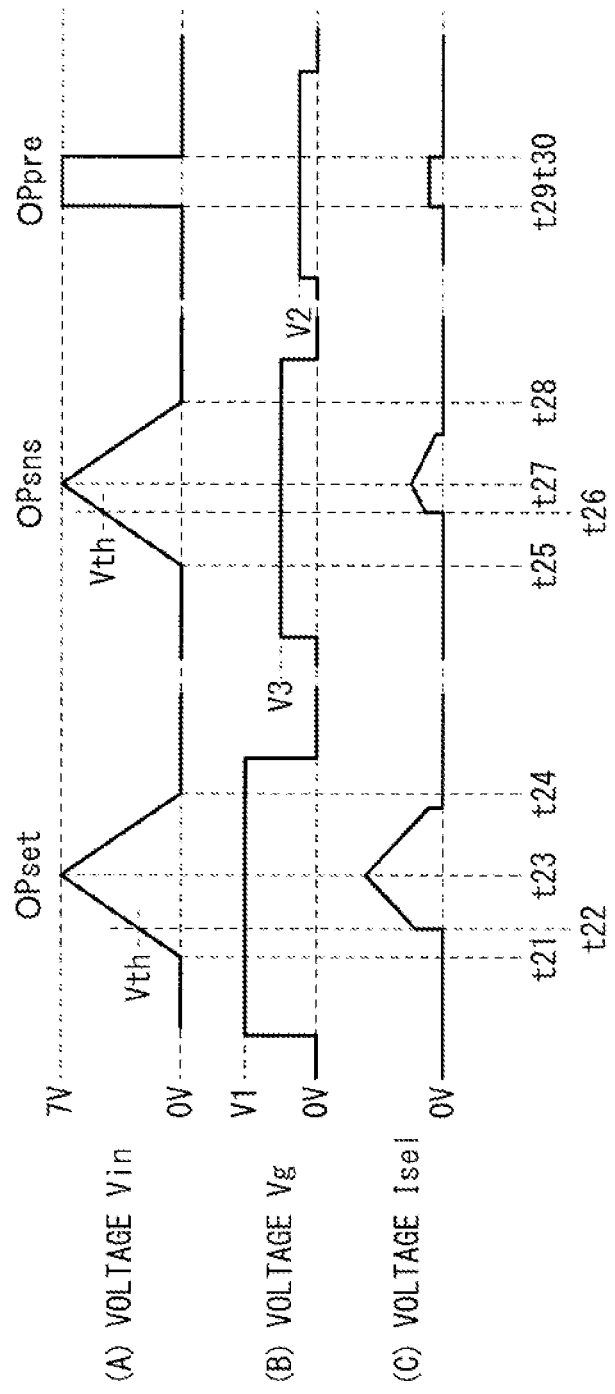
FIG. 11 is a waveform chart illustrating a measurement example of the test device.

FIG. 11 illustrates a measurement example of the test device 90A, where (A) illustrates a waveform of the voltage Vin applied to the terminal TA, (B) illustrates a waveform of the voltage Vg applied to the terminal TC, and (C) illustrates a waveform of the electric current Isel lowing through the test device 90A.

In the set operation OPset, in a similar manner to the semiconductor device 1, the measurement device 101A sets the voltage Vg to the voltage V1, thereby limiting the electric current Isel to lower than or equal to the predetermined current value Icmpset (e.g., 100 uA). Further, in this example, in order to measure the threshold voltage Vth of the test device 90A, the measurement device 101A actually raises the voltage Vin from 0 V to 7 V during a period between timing t21 and timing t23, for example, in steps of 20 mV In tins example, the electric current Isel is beginning, to flow at timing t22; therefore, the voltage Vin at timing t22 is the threshold voltage Vth. Thereafter, during a period between timing t23 and tinting t24, the measurement device 101A gradually lowers the voltage Vim from 7 V to 0 V.

In the sense operation OPsns, in a similar manner to the semiconductor device 1, the measurement device 101A sets the voltage Vg to the voltage V3, thereby limiting the electric current Isel to lower than or equal to the predetermined current value Icmpsns (e.g., 5 uA). Further, the r measurement device 101A gradually raises the voltage Vin from 0 V to 7 V during, a period between timing t25 and timing t27. In this example, the electric current Isel is beginning to flow at timing t26; therefore, the voltage Vin at timing t26 is the threshold voltage Vth. Thereafter, during a period between timing t27 and timing t28, the measurement device 101A gradually lowers the voltage Vin from 7 V to 0 V.

In the preparation operation OPpre, in a similar manner to the semiconductor device 1, the measurement device 101A sets the voltage Vg, to the voltage V2, thereby limiting the electric current Isel to lower than or equal to the predetermined current value Icmppre. It is possible to set the predetermined current value Icmppre to, for example, lower than or equal to the predetermined current value Icmpsns (e.g., 5 uA) in the sense operation OPsns. In this example, the measurement device 101A sets the voltage Vin to 7 V during a period between timing t29 and timing t30.

Figure 12:
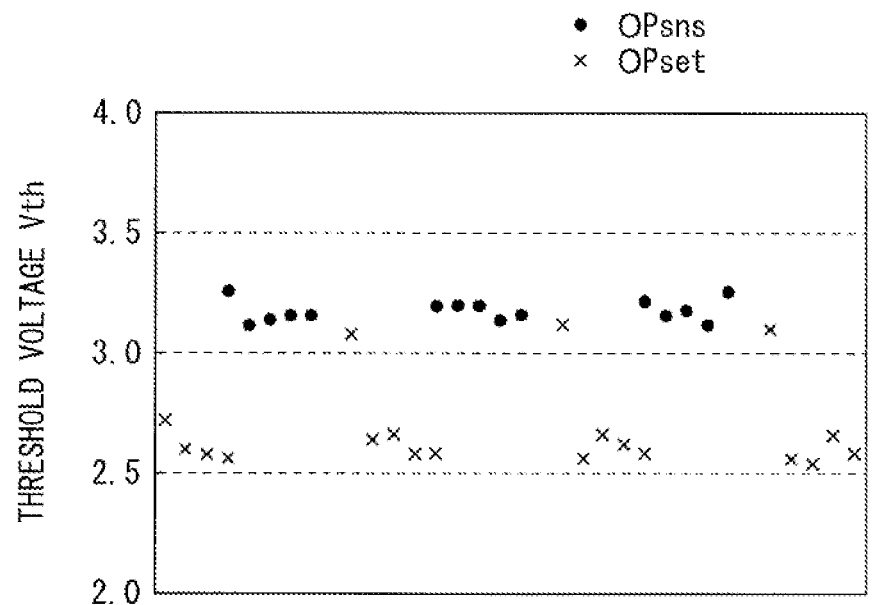
FIG. 12 is a characteristic diagram illustrating an example of measurement result of the test device.

FIG. 12 illustrates an example of a measurement result of the threshold voltage Vth according to the experimental example A. In this example, the change in the threshold voltage Vth is represented when five set operations OPset and five sense operations OPsns are alternately repeated. In this example, the threshold voltage Vth in the sense operation OPsns is about 3.1 V to 3.3 V. In contrast, the threshold voltage Vth in the set operation OPset differs from the threshold voltage Vth in the sense operation OPsns. Specifically, the threshold voltage Vth in the first set operation OPset after the sense operation OPsns is about 3.1 V, and threshold voltage Vth in the second to fifth set operations OPset is about 2.5 V to 2.7 V.

The change in the threshold voltage Vth in the set operation OPset is considered to be attributed to that the threshold voltage Vth of the test device 90A changes in response to the electric current that has flowed through the selection element SE in the immediately previous operation. In the first set operation OPset, the electric current Isel is limited to lower than or equal to the predetermined current value Icmpsns (about 5 uA) in the immediately previous sense operation OPsns, and in the second to fifth set operations OPset, the electric current Isel is limited lower than or equal to the predetermined current value Icmpset (about 100 uA) in the immediately previous set operation OPset. Thus, it is considered that the threshold voltage Vth in the first set operation OPset becomes approximately the same as the threshold voltage Vth in the sense operation OPsns, and the threshold voltage Vth in the second to fifth set operations OPset differs from the threshold voltage Vth in the first set operation OPset.

Experimental Example B

In the experimental example A, a so-called memory-effect has been confirmed, in which the threshold voltage Vth of the test device 90A changes in response to the electric current flowing through the selection element SE in the immediately previous operation. In an experimental example B, in order to avoid such a memory effect, the preparation operation OPpre is performed after each of the operations of the set operation OPset and the sense operation OPsns. A measurement circuit. 100B in the experimental example B is similar to the measurement circuit 100A FIG. 10).

FIG. 12 illustrates an example of a measurement result of the threshold voltage Vth according to the experimental example B. In this example, the preparation operation OPpre is performed every time the set operation OPset is performed once, and similarly, the preparation operation OPpre is performed every time the sense operation OPsns is performed once. In this example, the threshold voltage Vth in the set operation OPset is approximately the same as the threshold voltage Vth in the sense operation OPsns, and is about 3.1 V to 3.3 V. That is, in this example, in the set operation OPset, the electric current Isel is limited to lower than or equal to the predetermined current value Icmpspre in the immediately previous preparation operation OPpre, and similarly, in the sense operation OPsns, the electric current Isel is limited to lower than or equal to the predetermined current value Icmpspre in the immediately previous preparation operation OPpre. In this manner, in the experimental example B, the preparation operation OPpre is performed between operations. In other words, in the experimental example B, an operation of a predetermined electric current is intentionally inserted between operations. This makes it possible, in the experimental example B, to cause the threshold voltage Vth in the set operation OPset to be approximately the same as the threshold voltage Vth in the sense operation OPsns.

Experimental Example C

In an experimental example C, a test device 90C in which a memory layer corresponding to the memory element VR is formed in addition to the OTS layer corresponding to the selection element SE has been manufactured on an experimental basis, and measurements similar to those of the experimental example B have been performed.

Figure 14:
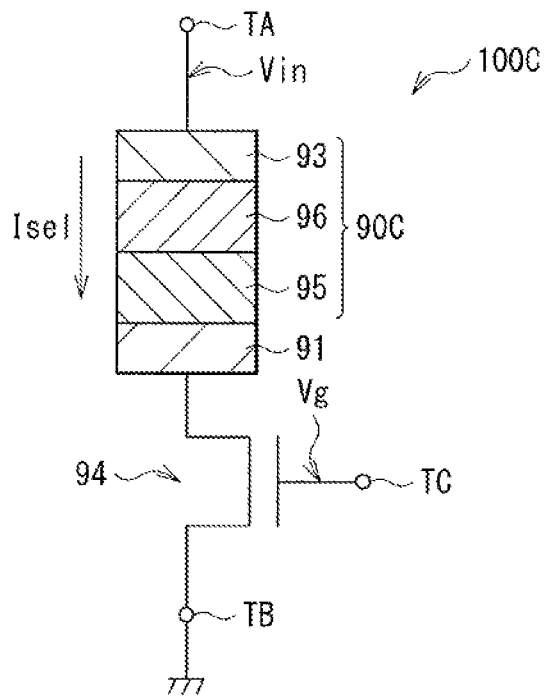
FIG. 14 is a circuit diagram illustrating a configuration example a measurement circuit that measures characteristics of another test device.

FIG. 14 illustrates an example of a measurement circuit 100C for measuring characteristics of the test device 90C according to the experimental example C. The test device 90C includes an OTS layer 95 and a memory layer 96. In the test device 90C, the OTS layer 95 is formed over the electrode 91, the memory layer 96 is formed over the OTS layer 95, and the electrode 93 is framed over the memory layer 96. The OTS layer 95 includes a material containing a chalcogen element, and corresponds to the selection element SE (FIGS. 2 and 3) according to the present embodiment. The memory layers 96 correspond to the memory element VR (FIGS. 2 and 3) according to the present embodiment. That is, the test device 90C corresponds to the memory cell MC (FIGS. 2 and 3) according to the present embodiment.

Figure 13:
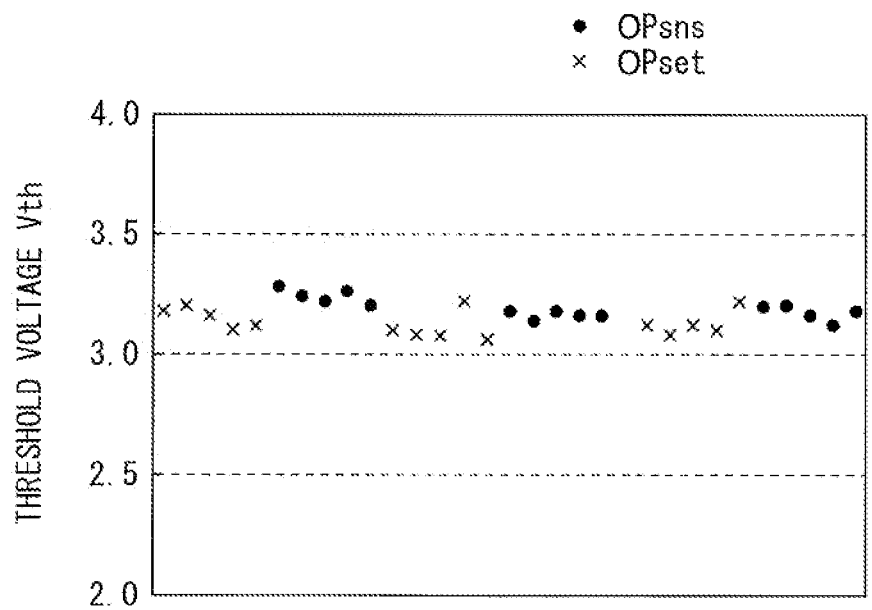
FIG. 13 is a characteristic diagram illustrating an example of another measurement result of the test device.
Figure 15:
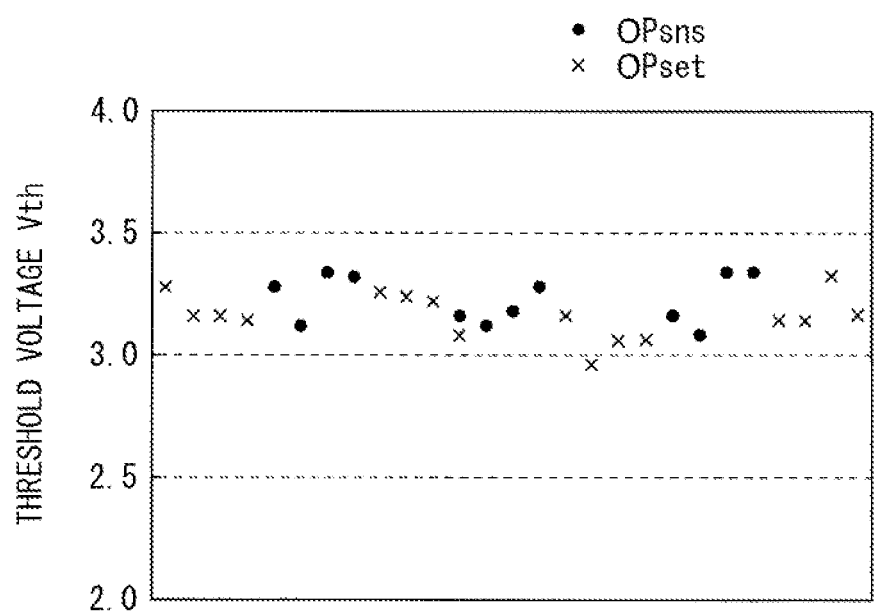
FIG. 15 is a characteristic diagram illustrating an example of the other test device.

FIG. 15 illustrates an example of a measurement result of the threshold voltage Vth according to the experimental example C. In this example, four set operations OPset and four sense operations OPsns are alternately repeated. Further, the preparation operation OPpre is performed every time the set operation OPset is performed once, and similarly, the preparation operation OPpre is performed every time the sense operation OPsns is performed once. As described above, also in the case where the memory layer 96 is formed in addition to the OTS layer 95, it is possible to cause the threshold voltage Vth in the set operation OPset to be approximately the same as the threshold voltage Vth in the sense operation OPsns, as in the case of the above-described experimental example B (FIG. 13).

Experimental Example D

In an experimental example D, the threshold voltage Vth of the test device 90C including the OTS layer 95 and the memory layers 96 is measured when the set operation OPset and the reset operation OPrst are performed.

Figure 16:
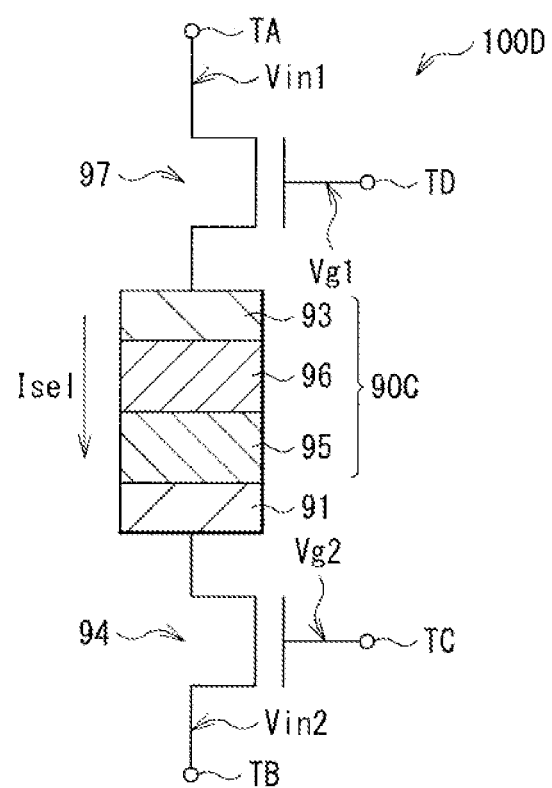
FIG. 16 is a circuit diagram illustrating a, configuration example of a measurement circuit that measures characteristics of the other test device.

FIG. 16 illustrates an example of a measurement circuit 100D for measuring characteristics of the test device 90C according to the experimental example D. The electrode 93 of the test device 90C is coupled to the terminal TA via a transistor 97. The transistor 97 is an N-type MOS transistor, a drain of the transistor 97 is coupled to the electrode 93 of the test device 90C, a source of the transistor 97 is coupled to the terminal TA, and a gate of the transistor 97 is coupled to a terminal TD. Further, the electrode 91 of the test device 90C is coupled to the terminal TB via, the transistor 94. A voltage Vin1 is applied to the terminal TA by a measurement device 101D (not illustrated) and a voltage Vg1 is applied to the terminal TD by the measurement device 101D. Further, a voltage Vin2 is applied to the terminal TB by the measurement device 101D, and a voltage Vg2 is applied to the terminal TC by the measurement device 101D. Moreover, the electric current Isel flowing through the test device 90C is measured by the measurement device 101D.

Figure 17:
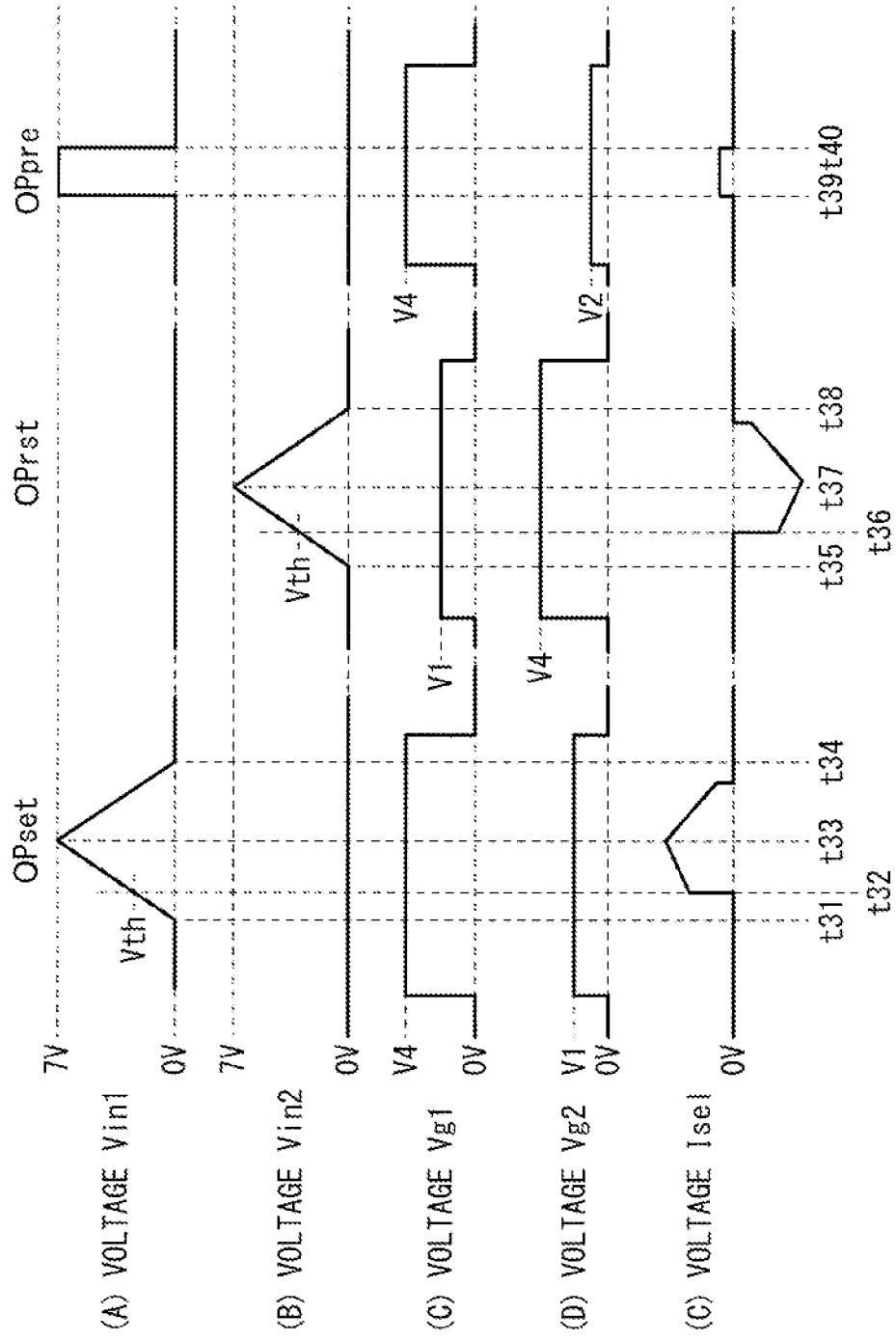
FIG. 17 is a waveform chart illustrating a measurement example of the other test device.

FIG. 17 illustrates a measurement example of the test device 90C, where (A) illustrates a waveform of the voltage Vin1 applied to the terminal TA, (B) illustrates a waveform of the voltage Vin2 applied to the terminal TB, (C) illustrates a waveform of the voltage Vg1 applied to the terminal TD, (D) illustrates a waveform of the voltage Vg2 applied to the terminal TC, and (E) illustrates a waveform of the electric current Isel flowing through the test device 90C.

In the set operation OPset, in a similar manner to the semiconductor device 1, the measurement device 101D sets the voltage Vg2 to the voltage V1, thereby limiting the electric current Isel to lower than or equal to the predetermined current value Icmpset (e.g., 100 uA). Further, during a period between timing t31 and timing t33, the measurement device 101D gradually raises the voltage Vin1 from 0 V to 7 V, for example, in steps of 20 mV, and also maintains the voltage Vin2 at 0 V. In this example, the electric current Isel is beginning to flow at timing t32; therefore, the voltage Vin1 at timing t32 is the threshold voltage Vth.

In the reset operation OPrst, the measurement device 101D sets the voltage Vg1 to the voltage V1, thereby limiting the electric current Isel to lower than or equal to the predetermined current value Icmpset, (e.g., 100 uA). Further, during a period between timing t35 and timing t37, the measurement device 101D gradually raises the voltage Vin2 from 0 V to 7 V, for example in steps of 20 mV, and also maintains the voltage Vin1 at 0 V. In this example, the electric current Isel is beginning to flow at tinting t36; therefore, the voltage Vin2 at timing t36 is the threshold voltage Vth.

In the preparation operation OPpre, in a similar manner to the semiconductor device 1, the measurement device 101D sets the voltage Vg2 to the voltage V2, thereby limiting the electric current Isel to lower than or equal to the predetermined current value Icmppre. It is possible to set the predetermined current value Icmppre to, for example, lower than or equal to the predetermined current value Icmpsns (e.g., 5 uA) in the sense operation OPsns. In this example, during a period between timing t39 and timing t40, the measurement device 101D sets the voltage Vin1 to 7 V, and also maintains the voltage Vin2 at 0 V.

Figure 18:
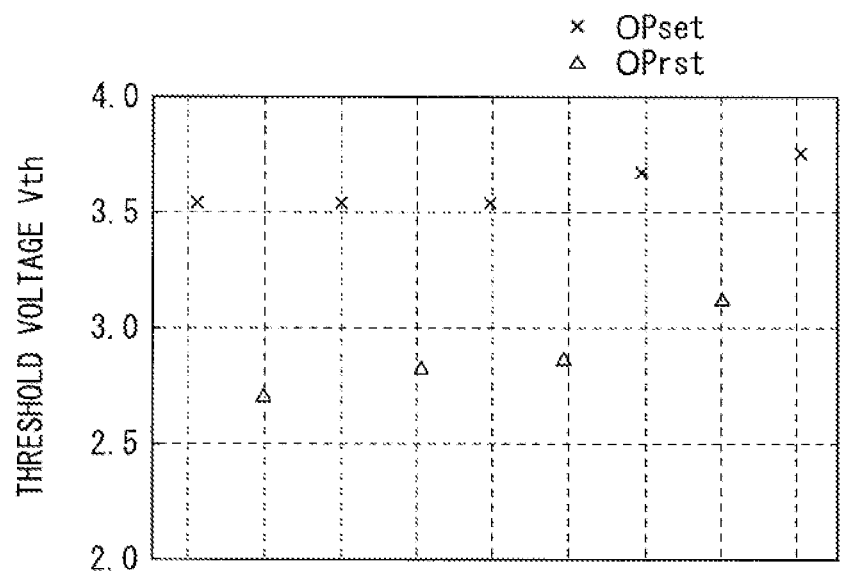
FIG. 18 is a characteristic diagram illustrating an example of a measurement result of the other test device.

FIG. 18 illustrates an example of a measurement result of the threshold voltage Vth according to the experimental example D. In this example, one operation OPset and one reset operation OPrst have been repeated alternately. In this example, the threshold voltage Vth in the set operation. OPset is about 3.5 V to 3.8 V, and the threshold voltage Vth in the reset operation OPrst is about 2.7 V to 3.1 V. Thus, in the experimental example D, the threshold voltage Vth in the reset operation OPrst differs from the threshold voltage Vth in the set operation OPset.

Experimental Example E

In an experimental example E, the preparation operation OPpre is performed after each of the operations of the set operation OPset and the reset operation OPrst. A measurement circuit 100E in the experimental example E is similar to the measurement circuit 100D (FIG. 16).

Figure 19:
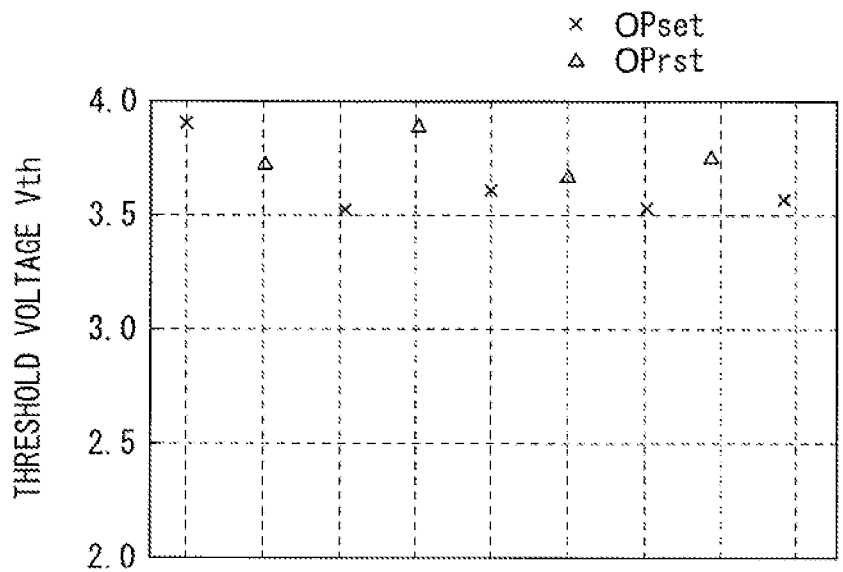
FIG. 19 is a characteristic diagram illustrating an example of another measurement result of the other test device.

FIG. 19 illustrates an example of a measurement result of the threshold voltage Vth according to the experimental example E. In this example, one operation OPset and one reset operation OPrst have been repeated alternately. The preparation operation OPpre is performed every time the set operation OPset is performed once, and similarly, the preparation operation OPpre is performed every time the reset operation OPrst is performed once. In this example, the threshold voltage Vth in the reset operation OPrst is approximately the same as the threshold voltage Vth in the set operation OPset, and is about 3.5 V to 3.9 V. As described above, in the experimental example E, by performing the preparation operation OPpre between operations, it is possible to make the threshold voltage Vth in the set operation OPset approximately the same as the threshold voltage Vth in the sense operation OPsns.

As illustrated in the above experimental examples A to E, by performing preparation operation OPpre between operations, it is possible to suppress the change in the threshold voltage Vth.

Therefore, in the semiconductor device 1, the preparation operation OPpre is performed after the set operation OPset, the reset operation OPrst, and the sense operation OPsns. Accordingly, in the semiconductor device 1, it is possible to suppress a change in the threshold voltage of the selection element SE in the set operation OPset after the preparation operation OPpre, the reset operation OPrst after the preparation operation OPpre, or the sense operation OPsns after the preparation operation OPpre, and as a result, it is possible to achieve a stable operation.

[Effects]

As described above, in the present embodiment, since the preparation operation is performed after the set operation, the reset operation, and the sense operation, it is possible to achieve a stable operation.

Modification Example 1

In the above embodiment, as illustrated in FIG. 8, the non-selection voltage Vinh is applied to the row selection line RL and to the column selection line CL related to the memory cell MC, after the set operation OPset, the reset operation OPrst, and the sense operation OPsns are performed, but the present disclosure is not limited thereto. Alternatively, fix example, after the set operation OPset, the reset operation OPrst, and the sense operation OPsns are performed, the preparation operation OPpre may be consecutively performed without applying the non-selection voltage Vinh to the row selection line RL and to the column selection line CL. Hereinafter, a semiconductor device 1A according to the present modification example will be described in detail. The semiconductor device 1A includes a drive controller 20A. The drive controller 20A includes a controller 21A.

Figure 20:
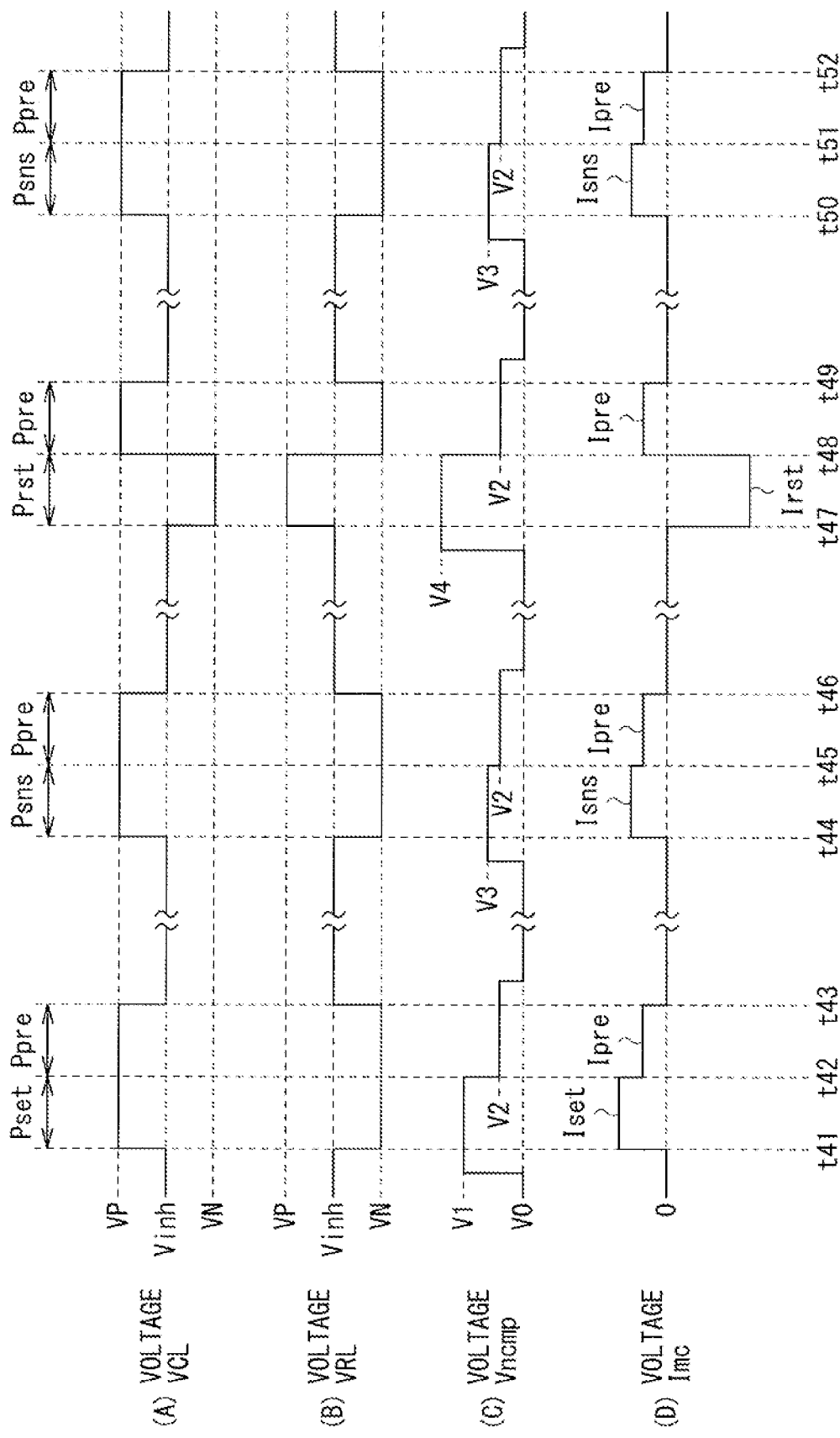
FIG. 20 is a timing diagram illustrating an operation example of a semiconductor device according to a modification example.

FIG. 20 illustrates an operation example of the semiconductor device 1A. The semiconductor device 1A performs the set operation OPset during a period between timing t41 and timing t42 (set operation period Pset) and, immediately afterwards, consecutively performs the preparation operation OPpre during a period between timing t42 and timing t43 (preparation operation period Ppre). Specifically, first, at a timing prior to timing t41, the controller 21A sets the voltage Vncmp to the voltage V1 (FIG. 20(C)). The current limitation circuit 32 thereby limits the current value of the electric current Ime flowing through the memory cell MC to lower than or equal to the predetermined current value Icmpset (100 uA in this example). Thereafter, at timing t41, the column selection line driver 40 changes the voltage VCL to the selection voltage VP, and the row selection line driver 30 changes the voltage VRL to the selection voltage VN (FIG. 20(A) and (B)). Thus, in the selected memory cell MC, the set current Iset flows (FIG. 20(D)), and the resistance state RS of the memory element YR in the selected memory cell MC is set to the low resistance state LRS. Next, at timing t42, the controller 21A sets the voltage Vncmp to the voltage V2 (FIG. 20(C)). The current limitation circuit 32 thereby limits the current value of the electric current hue flowing through the memory cell MC to lower than or equal to the predetermined current value Icmppre. In this example, the predetermined current value Icmppre is set to a value lower than the predetermined current value Icmpsns (5 uA in this example) in the sense operation OPsns. As a result, the preparation current Ipre flows through the selected memory cell MC (FIG. 20(D)). Thereafter, at timing t43, the column selection line driver 40 changes the voltage VCL to the non-selection voltage Vinh, and the row selection line driver 30 changes the voltage VRL to the non-selection voltage Vinh (FIG. 20(A) and (B)). Then, at a timing after timing t43, the controller 21A sets the voltage Vncmp to the voltage V0 (FIG. 20(C)).

Next, the semiconductor device 1A performs the sense operation OPsns during a period between timing t44 and timing t45 (sense operation period Psns) and immediately afterwards, consecutively performs the preparation operation OPpre during a period between timing t45 and timing t46 (preparation operation period Ppre). Specifically, first, at a timing prior to timing t44, the controller 21A sets the voltage Vncmp to the voltage V3 (FIG. 20(C)). The current limitation circuit 32 thereby limits the current value of the electric current lime flowing through the memory cell MC to lower than or equal to the predetermined current value Icmpsns (5 uA in this example). Thereafter, at timing t44, the column selection line driver 40 changes the voltage VCL to the selection voltage VP, and the row selection line driver 30 changes the voltage VRL to the selection voltage VN (FIG. 20(A) and (B)). As a result, the sense current has flows through the selected memory cell MC (FIG. 20(D)). Further, the sense amplifier 34 determines the resistance state RS of the memory element VR in the selected memory cell MC. In this example, during the period between timing t41 and timing t42, since the resistance state RS of the memory element VR is set to the low resistance state LRS, the sense amplifier 34 determines that the resistance state RS of the memory element VR is the low resistance state LRS. Next, at timing t45, the controller 21A sets the voltage Vncmp to the voltage V2 (FIG. 20(C)). The current limitation circuit 32 thereby limits the current value of the electric current Imc flowing through the memory cell MC to lower than or equal to the predetermined current value Icmppre. As a result, the preparation current Ipre flows through the selected memory cell MC (FIG. 20(D)). Thereafter, at timing t46, the column selection line driver 40 changes the voltage VCL to the non-selection voltage Vinh, and the row selection line driver 30 changes the voltage VRL to the non-selection voltage Vinh (FIG. 20(A) and (B)). Then, at a timing after timing t46, the controller 21A sets the voltage Vncmp to the voltage V0 (FIG. 20(CD).

Similarly, the semiconductor device 1A performs the reset operation OPrst during a period between timing t47 and timing t48 (reset operation period Prst) and, immediately afterwards, consecutively performs the preparation operation OPpre during a period between timing t48 and timing t49 (preparation operation period Ppre). Further, the semiconductor device 1A performs the sense operation OPsns dining a period between timing t50 and timing t51 (sense operation period Psns) and, immediately afterwards, consecutively performs the preparation operation OPpre during a period between tinning t51 and timing t52 (preparation operation period Ppre). In this example, since the resistance state RS of the memory element VR is set to the high resistance state HRS during the period between timing t47 and timing t48, the sense amplifier 34 determines that the resistance state RS of the memory element VR is the high resistance state HRS in the sense operation OPsns.

Modification Example 2

In the above embodiment, as illustrated in FIG. 8, the set operation OPset, the reset operation OPrst, and the sense operation OPsns are performed after the non-selection voltage Vinh is applied to the row selection line RL and to the column selection line CL, but the present invention is not limited thereto. Alternatively, for example, after the preparation operation OPpre is performed, the set operation OPset, the reset operation OPrst, and the sense operation OPsns may be consecutively performed without applying the non-selection voltage Vinh to the row selection line RL and to the column selection line CL. Hereinafter, a semiconductor device 1B according to the present modification example will be described in detail. The Semiconductor device 1B includes a drive controller 20B. The drive controller 20B includes a controller 21B.

Figure 21:
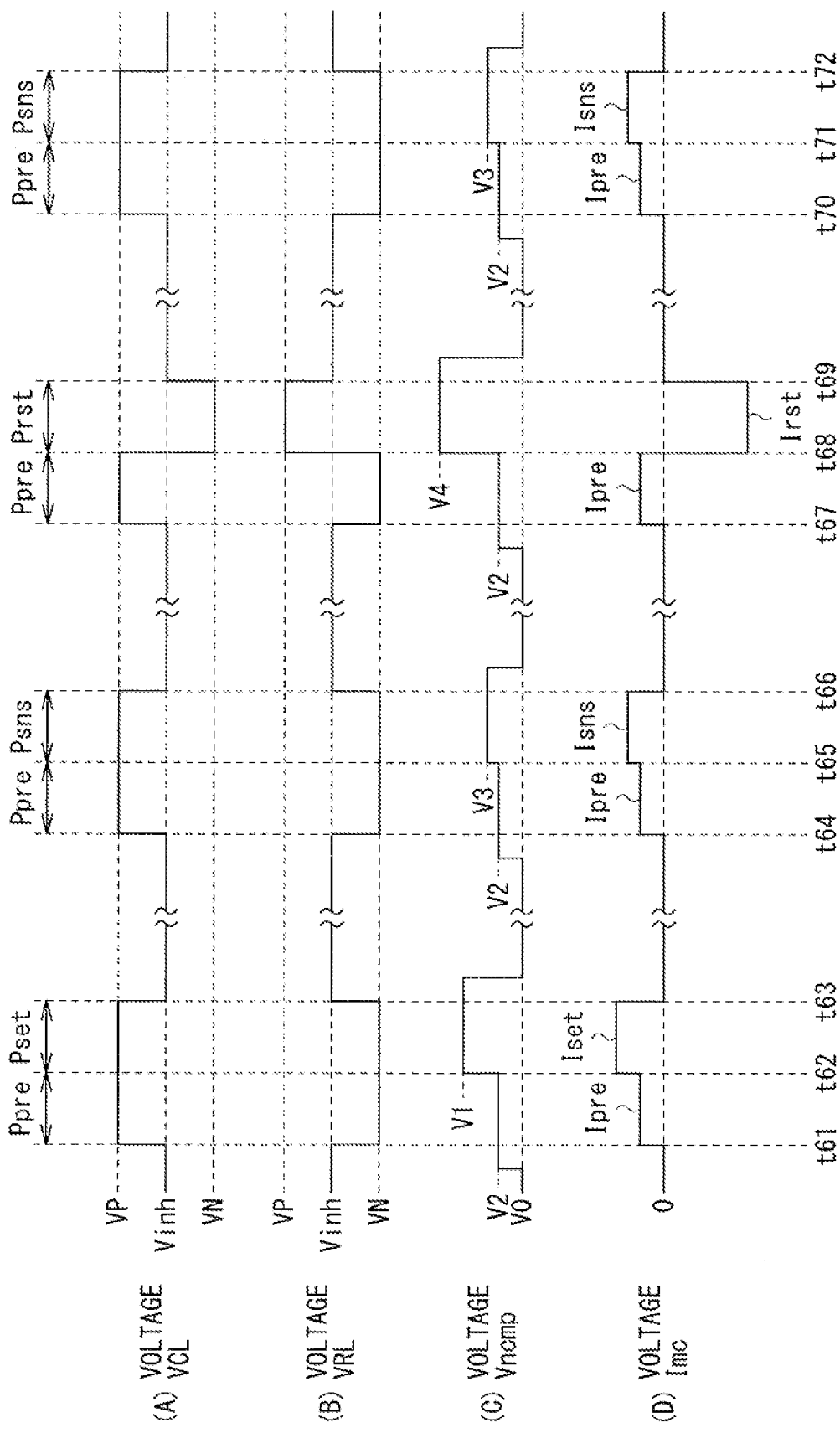
FIG. 21 is a timing diagram illustrating an operation example of a semiconductor device according to another modification example.

FIG. 21 illustrates an operation example of the semiconductor device 1B. The semiconductor device 1B performs the preparation operation OPpre during a period between timing t61 and timing t62 (preparation operation period Ppre) and, immediately afterwards, consecutively performs the set operation OPset during a period between timing t62 and timing t63 (set operation period Pset). Specifically, first, at a timing prior to timing t61, the controller 21B sets the voltage Vncmp to the voltage V2 (FIG. 21(C)). The current limitation circuit 32 thereby limits the current value of the electric current line flowing through the memory cell MC to lower than or equal to the predetermined current value Icmppre. In this example, the predetermined current value Icmppre is set to a value lower than the predetermined current value Icmpsns (5 uA in this example) in the sense operation OPsns. At timing t61, the column selection line driver 40 changes the voltage VCL to the selection voltage VP, and the row selection line driver 30 changes the voltage VRL to the selection voltage VN (FIG. 21 (A) and (B)). Thus, the preparation current Ipre flows through the selected memory cell MC (FIG. 21(D)). Next, at timing t62, the controller 21B sets the voltage Vncmp to the voltage V1 (FIG. 21(C)). The current limitation circuit 32 thereby limits the current value of the electric current line flowing through the memory cell MC to lower than or equal to the predetermined current value Icmpset (100 uA in this example). Thus, in the selected memory cell MC, the set current Iset flows (FIG. 21(D)), and the resistance state RS of the memory element VR in the selected memory cell MC is set to the low resistance state LRS. At timing t63, the column selection line driver 40 changes the voltage VCL to the non-selection voltage Vinh, and the row selection line driver 30 changes the voltage VRL to the non-selection voltage Vinh (FIG. 21(A) and (B)). Then, at a timing after timing t63, the controller 21B sets the voltage Vncmp to the voltage V0 (FIG. 21(C)).

Next, the semiconductor device 1B performs the preparation operation OPpre during a period between timing t64 and timing t65 (preparation operation period Ppre) and, immediately afterwards, consecutively performs the sense operation OPsns during a period between timing t65 and timing t66 (sense operation period Psns). Specifically, first, at a timing prior to timing t64, the voltage Vncmp is set to the voltage V2 (FIG. 21(C)). The current limitation circuit 32 thereby limits the current value of the electric current line flowing through the memory cell MC to lower than or equal to the predetermined current value Icmppre. Thereafter, at timing t64, the column selection line driver 40 changes the voltage VCL to the selection voltage VP, and the row selection line driver 30 changes the voltage VRL to the selection voltage VN (FIG. 21(A) and (B)). As a result, the preparation current Ipre flows through the selected memory Cell MC (FIG. 21(D)). Next, at timing 165, the controller 21B sets the voltage Vncmp to the voltage V3 (FIG. 21(C)).

The current limitation circuit 32 thereby limits the current value of the electric current line flowing through the memory cell MC to lower than or equal to the predetermined current wane Icmpsns (5 uA in this example). As a result, the sense current Isns flows through the selected memory cell MC (FIG. 21(D)). Then, the sense amplifier 34 determines the resistance state RS of the memory element VR in the selected memory cell MC. In this example, since the resistance state RS of the memory element VR is set to the low resistance state LRS during the period between timing 162 and timing t63, the sense amplifier 34 determines that the resistance state RS of the memory element VR is the low resistance state LRS. Thereafter, at timing t66, the column selection line driver 40 changes the voltage VCL to the non-selection voltage Vinh, and the row selection line driver 30 changes the voltage VRL to the non-selection voltage Vinh (FIG. 21(A) and (B)). Then, at a timing after timing t66, the controller 21B sets the voltage Vncmp to the voltage V0 (FIG. 21(C)).

Similarly, the semiconductor device 1B performs the preparation operation OPpre in a period between timing t67 and timing 168 (preparation operation period Ppre) and, immediately afterwards, consecutively performs the reset operation OPrst during a period between timing t68 and timing t69 (reset operation period Prst). Further, the semiconductor device 1B performs the prep operation OPpre during a period between timing t70 and timing t71 (preparation operation period Ppre) and, immediately afterwards, consecutively performs the sense operation OPsns during a period between timing t71 and timing t72 (sense operation period Psns). In this example, since the resistance state RS of the memory element VR is set to the high resistance state HRS in the period between timing t68 and timing t69, the sense amplifier 34 deter nines that the resistance state RS of the memory element VR is the high resistance state HRS in the sense operation OPsns.

Modification Example 3

In the above embodiment, the preparation operation OPpre is performed after the set operation OPset, the reset operation OPrst, and the sense operation OPsns. The preparation operation OPpre may be, for example, the same operation as the sense operation OPsns. In this case, in the sense operation OPsns functioning as the preparation operation OPpre, it is desirable to discard the data read from the memory cell MC, for example.

Modification Example 4

In the above embodiment, the row selection line driver 30 is provided with the current limitation circuit 32 that limits the current value of the electric current flowing through the selected memory cell MC, but the present disclosure is not limited thereto. Alternatively, for example, row selection line driver 30 may not necessarily be provided with the current limitation circuit 32, and the column selection line driver 40 may be provided with a current limitation circuit. A semiconductor device 1D according to the present modification example includes a drive controller 20D. The drive controller 20D includes a controller 21D, a row selection line driver 30D, and a column selection line driver 40D.

The controller 21D controls operation of the row selection line driver 30D and the column selection line driver 40D on the basis of a write command, write data, and a read command supplied from the outside.

The row selection line driver 30D is obtained by omitting the current limitation circuit 32 from the row selection line driver 30 (FIG. 6) according to the above embodiment, and coupling the selection voltage generation circuit 31 and the node N33 of the decoder 33.

Figure 22:
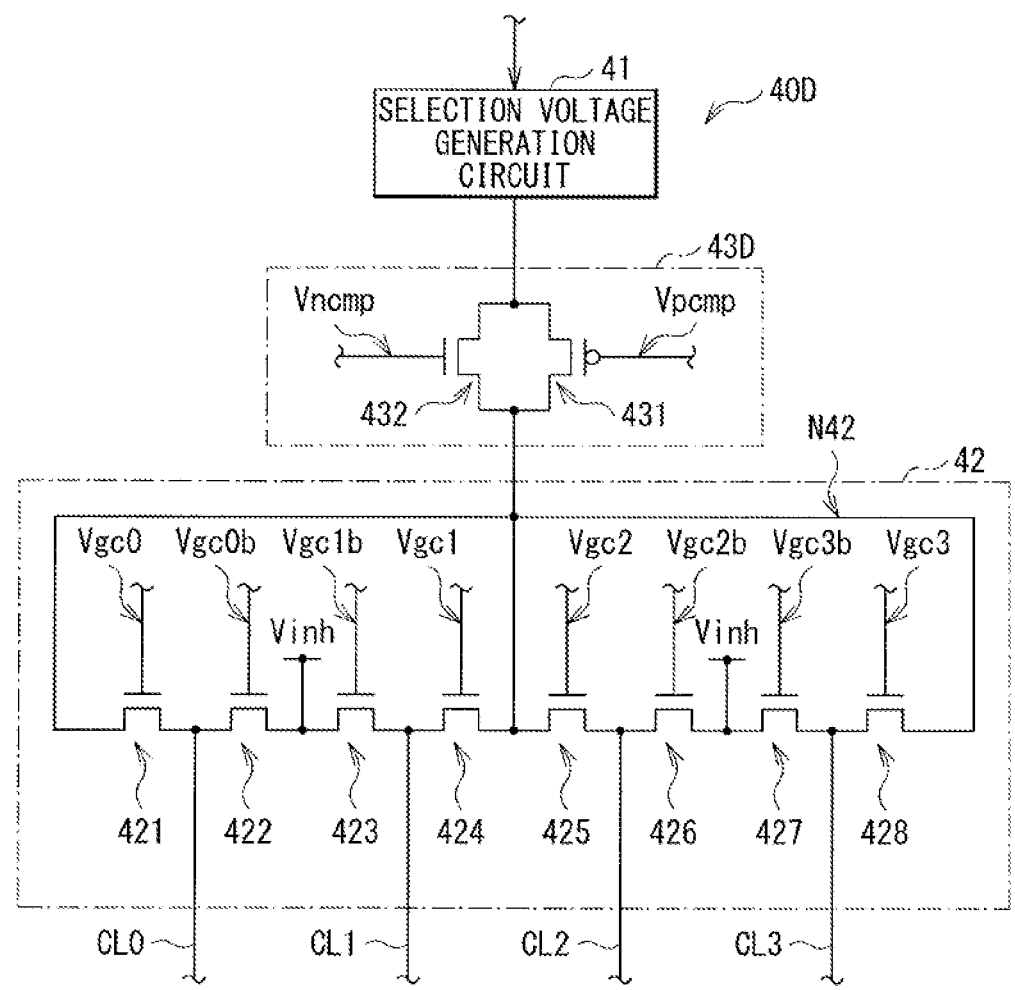
FIG. 22 is a circuit diagram illustrating a configuration example of a column selection line driver according to another modification example.

FIG. 22 illustrates a configuration example of the column selection line driver 40D according to the present modification example. The column selection line driver 40D includes a current limitation circuit 43D.

The current limitation circuit 43D limits the current value of the electric current flowing through the selected memory cell MC on the basis of the voltages Vpcmp and Vncmp a supplied from the controller 21D. The current limitation circuit 43D includes transistors 431 and 432. The transistor 431 is a P-type MOS transistor, a gate of the transistor 431 is supplied with the voltage Vpcmp, a source of the transistor 431 is coupled to a source of the transistor 432 and to the selection voltage generation circuit 41, and a drain is coupled to a drain of the transistor 432 and to the node N42 of the decoder 42. The transistor 432 is an N-type MOS transistor, a gate of the transistor 432 is supplied with the voltage Vncmp, the source of the transistor 432 is coupled to the source of the transistor 431 and to the selection voltage generation circuit 41, and the drain is coupled to the drain of the transistor 431 and to the node N42 of the decoder 42.

In a case where the selection voltage generation circuit 41 outputs the selection voltage VP (e.g., 7 V) in the set operation OPset, the current limitation circuit 43D limits the current value of the electric current flowing through the selected memory cell MC to lower than or equal to the predetermined current value Icmpset (e.g., 100 uA) on the basis of the voltage Vpcmp, which is an analog voltage supplied from the controller 21D. Further, in a case where the selection voltage generation circuit 41 outputs the selection voltage VN (e.g., 0 V) in the reset operation OPrst, the current limitation circuit 43D operates so as not to limit the electric current on the basis of the high-level voltage Vncmp supplied from the controller 21D. Further, in a case were the selection Voltage generation circuit 41 outputs the selection voltage VP (e.g., 7 V) in the sense operation OPsns, the current limitation circuit 43D limits the current value of the electric current flowing through the selected memory cell MC to lower than or equal to the predetermined current value Icmpsns (e.g., 5 uA) on the basis of the voltage Vpcmp, which is an analog voltage supplied from the controller 21D. Further, in a case where the selection voltage generation circuit 41 outputs the selection voltage VP (e.g., 7 V) in the preparation operation OPpre, the current limitation circuit 43D limits the current value of the electric current flowing through the selected memory cell MC to lower than or equal to the predetermined current value Icmppre on the basis of the voltage Vpcmp, which is an analog voltage supplied from the controller 21D. It is possible to set the predetermined current value Icmppre, for example, to a value less than or equal to the predetermined current value Icmpsns (e.g. 5 uA) in the sense operation OPsns.

It is to be noted that, in this example, although the row selection line driver 30D including no current limitation circuit 32 and the column selection line driver 40D including the current limitation circuit 43D are used, the present disclosure is not limited thereto, and instead, for example, the row selection line driver 30 including the current limitation circuit 32 (FIG. 6) and the column selection line driver 40D including the current limitation circuit 43D (FIG. 22) may be used.

Modification Example 5

Figure 23A:
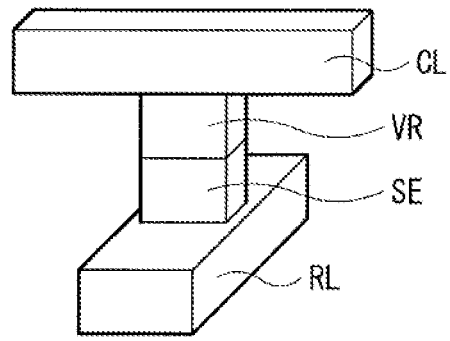
FIG. 23A is an explanatory diagram illustrating a configuration example of a semiconductor device according to another modification example.
Figure 23B:
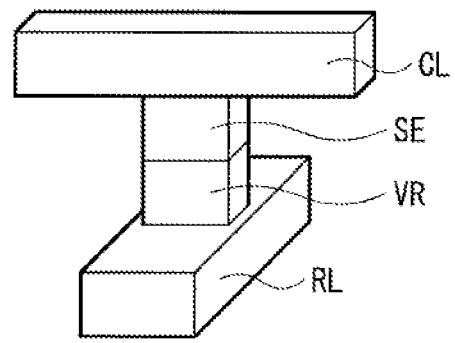
FIG. 23B is an explanatory diagram illustrating a configuration example of the semiconductor device according to the other modification example.
Figure 23C:
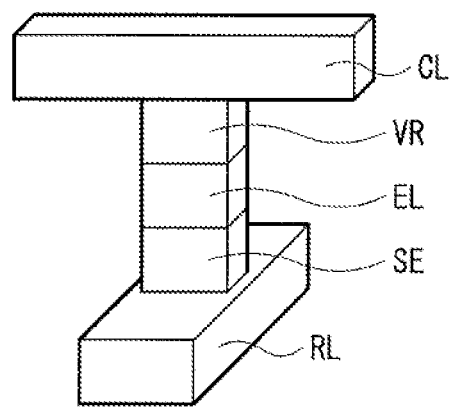
FIG. 23C is an explanatory diagram illustrating a configuration example of the semiconductor device according to the other modification example.
Figure 23D:
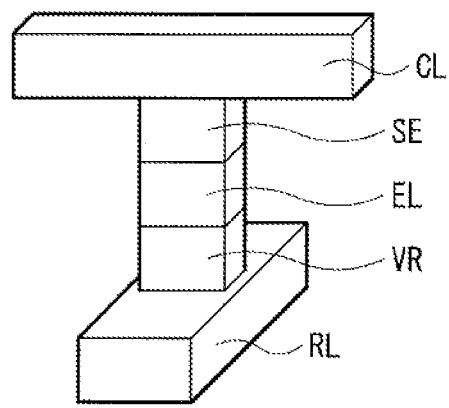
FIG. 23D is an explanatory diagram illustrating a configuration example of the semiconductor device according to the other modification example.

In the above embodiment, as illustrated in FIG. 23A, the memory element VR is formed on the selection element SE, but the present disclosure is not limited thereto. For example, as illustrated in FIG. 23B, the selection element SE may be formed on the memory element VR. For example, as illustrated in FIG. 23C, an intermediate electrode EL may be formed on the selection element SE, and the memory element VR may be formed on the intermediate electrode EL. For example, as illustrated in FIG. 23D, the intermediate electrode EL may be formed on the memory element VR and the selection element SE may be formed on the intermediate electrode EL.

Modification Example 6

Figure 24:
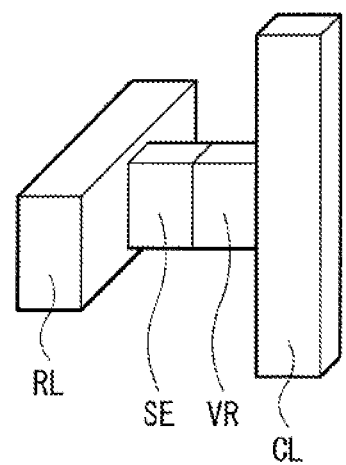
FIG. 24 is an explanatory diagram illustrating a configuration example of a semiconductor device according to another modification example.

In the above embodiment, the memory element VR and the selection element SE are formed side by side in a direction perpendicular to a substrate plane S; however, the present invention is not limited thereto, and as illustrated in FIG. 24, the memory element VR and the selection element SE may be formed side by side in a direction parallel to the substrate plane S. In this example, the row selection line RL is formed to extend in a direction parallel to the substrate plane S, and the column selection line CL is formed to extend in a direction perpendicular to the substrate plane S.

Other Modification Examples

Further, two or more of those modification examples may be combined.

Although the present technology is described hereinabove with reference to the example embodiments and modification examples, these embodiments and modification examples are not to be construed as limiting the scope of the present technology and may be modified in a wide variety of ways.

For example, the number of row selection lines RL, the number of column selection lines CL, voltage values of the selection voltages VP and VN, voltage values of the non-selection voltage Vinh, and the like in the above embodiments and the like are examples, and may be changed as appropriate.

It is to be noted that the effects described herein are mere examples, and the effects are not limited to those described herein. The present technology may further include any effects other than those described herein.

It is to be noted that the present technology may have the following configurations.

(1)

A semiconductor device including:

a memory cell that includes a first terminal, a second terminal, a memory element configured to take a first resistance state and a second resistance state, and a nonlinear element configured to be in an on-state when a voltage difference between both ends is larger than a predetermined voltage difference, the memory element and the nonlinear element being provided on a path between the first terminal and the second terminal; and a drive controller that performs a first operation in which a first voltage of the first terminal is caused to be higher than a second voltage of the second terminal to allow a resistance state of the memory element to be in the first resistance state, a second operation in which the first voltage is caused to be lower than the second voltage to allow the resistance state of the memory element to be in the second resistance state, a third operation in which the first voltage and the second voltage are caused to be different from each other and a current value of electric current flowing between the first terminal and the second terminal is caused to be limited to lower than or equal to a first current value to determine the resistance state of the memory element, and a fourth operation in which the first voltage and the second voltage are caused to be different from each other and the current value is caused to be limited to lower than or equal to a second current value, in which the drive controller performs the fourth operation after at least one of the first operation, the second operation, or the third operation.

(2)

The semiconductor device according to (1), in which the nonlinear element includes a material containing a chalcogen element.

(3)

The semiconductor device according to (1) or (2), in which the drive controller performs the fourth operation after the first operation.

(4)

The semiconductor device according to any one of (1) to (3), in which the drive controller performs the fourth operation after the second operation.

(5)

The semiconductor device according to any one of (1) to (4), in which the drive controller performs the fourth operation after the third operation.

(6)

The semiconductor device according to any one of (1) to (5), in which the drive controller consecutively performs the fourth operation immediately after at least one of the first operation, the second operation, or the third operation.

(7)

The semiconductor device according to any one of (1) to (6), in which the drive controller performs, after the fourth operation, any one of the first operation, the second operation, and the third operation.

(8)

The semiconductor device according to (7), in which the drive controller consecutively performs, immediately after the fourth operation, any one of the first operation, the second operation, and the third operation.

(9)

The semiconductor device according to any one of (1) to (8), in which the second current value is a current value lower than or equal to the first current value.

(10)

The semiconductor device according to any one of (1) to (9), in which the drive controller causes, in the third operation, the first voltage to be higher than the second voltage.

(11)

The semiconductor device according to any one of (1) to (10), in which the drive controller causes, in the fourth operation, the first voltage to be higher than the second voltage.

This application claims the benefit of Japanese Priority Patent Application JP2017-236830 filed with the Japan Patent Office on Dec. 11, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor device, comprising:
a memory cell that includes a first terminal, a second terminal, a memory element configured to take a first resistance state and a second resistance state, and a nonlinear element configured to be in an on-state when a voltage difference between both ends is larger than a predetermined voltage difference, the memory element and the nonlinear element being provided on a path between the first terminal and the second terminal; and
a drive controller that performs a first operation in which a first voltage of the first terminal is caused to be higher than a second voltage of the second terminal to allow a resistance state of the memory element to be in the first resistance state, a second operation in which the first voltage is caused to be lower than the second voltage to allow the resistance state of the memory element to be in the second resistance state, a third operation in which the first voltage and the second voltage are caused to be different from each other and a current value of electric current flowing between the first terminal and the second terminal is caused to be limited to lower than or equal to a first current value to determine the resistance state of the memory element, and a fourth operation in which the first voltage and the second voltage are caused to be different from each other and the current value is caused to be limited to lower than or equal to a second current value,
wherein the drive controller performs the fourth operation after at least one of the first operation, the second operation, or the third operation, and
wherein the nonlinear element includes a material containing a chalcogen element.

2. The semiconductor device according to claim 1, wherein the drive controller performs the fourth operation after the first operation.

3. The semiconductor device according to claim 1, wherein the drive controller performs the fourth operation after the second operation.

4. The semiconductor device according to claim 1, wherein the drive controller performs the fourth operation after the third operation.

5. The semiconductor device according to claim 1, wherein the drive controller consecutively performs the fourth operation immediately after at least one of the first operation, the second operation, or the third operation.

6. A semiconductor device, comprising:
a memory cell that includes a first terminal, a second terminal, a memory element configured to take a first resistance state and a second resistance state, and a nonlinear element configured to be in an on-state when a voltage difference between both ends is larger than a predetermined voltage difference, the memory element and the nonlinear element being provided on a path between the first terminal and the second terminal; and
a drive controller that performs a first operation in which a first voltage of the first terminal is caused to be higher than a second voltage of the second terminal to allow a resistance state of the memory element to be in the first resistance state, a second operation in which the first voltage is caused to be lower than the second voltage to allow the resistance state of the memory element to be in the second resistance state, a third operation in which the first voltage and the second voltage are caused to be different from each other and a current value of electric current flowing between the first terminal and the second terminal is caused to be limited to lower than or equal to a first current value to determine the resistance state of the memory element, and a fourth operation in which the first voltage and the second voltage are caused to be different from each other and the current value is caused to be limited to lower than or equal to a second current value, wherein the drive controller performs the fourth operation after at least one of the first operation, the second operation, or the third operation, and wherein the drive controller performs, after the fourth operation, any one of the first operation, the second operation, and the third operation.

7. The semiconductor device according to claim 6, wherein the drive controller consecutively performs, immediately after the fourth operation, any one of the first operation, the second operation, and the third operation.

8. The semiconductor device according to claim 1, wherein the second current value is a current value lower than or equal to the first current value.

9. A semiconductor device, comprising:
a memory cell that includes a first terminal, a second terminal, a memory element configured to take a first resistance state and a second resistance state, and a nonlinear element configured to be in an on-state when a voltage difference between both ends is larger than a predetermined voltage difference, the memory element and the nonlinear element being provided on a path between the first terminal and the second terminal; and
a drive controller that performs a first operation in which a first voltage of the first terminal is caused to be higher than a second voltage of the second terminal to allow a resistance state of the memory element to be in the first resistance state, a second operation in which the first voltage is caused to be lower than the second voltage to allow the resistance state of the memory element to be in the second resistance state, a third operation in which the first voltage and the second voltage are caused to be different from each other and a current value of electric current flowing between the first terminal and the second terminal is caused to be limited to lower than or equal to a first current value to determine the resistance state of the memory element, and a fourth operation in which the first voltage and the second voltage are caused to be different from each other and the current value is caused to be limited to lower than or equal to a second current value, wherein the drive controller performs the fourth operation after at least one of the first operation, the second operation, or the third operation, and wherein the drive controller causes, in the third operation, the first voltage to be higher than the second voltage.

10. A semiconductor device, comprising:
a memory cell that includes a first terminal, a second terminal, a memory element configured to take a first resistance state and a second resistance state, and a nonlinear element configured to be in an on-state when a voltage difference between both ends is larger than a predetermined voltage difference, the memory element and the nonlinear element being provided on a path between the first terminal and the second terminal; and a drive controller that performs a first operation in which a first voltage of the first terminal is caused to be higher than a second voltage of the second terminal to allow a resistance state of the memory element to be in the first resistance state, a second operation in which the first voltage is caused to be lower than the second voltage to allow the resistance state of the memory element to be in the second resistance state, a third operation in which the first voltage and the second voltage are caused to be different from each other and a current value of electric current flowing between the first terminal and the second terminal is caused to be limited to lower than or equal to a first current value to determine the resistance state of the memory element, and a fourth operation in which the first voltage and the second voltage are caused to be different from each other and the current value is caused to be limited to lower than or equal to a second current value, wherein the drive controller performs the fourth operation after at least one of the first operation, the second operation, or the third operation, and wherein the drive controller causes, in the fourth operation, the first voltage to be higher than the second voltage.

11. The semiconductor device according to claim 1, wherein the drive controller performs, after the fourth operation, any one of the first operation, the second operation, and the third operation.

12. The semiconductor device according to claim 11, wherein the drive controller consecutively performs, immediately after the fourth operation, any one of the first operation, the second operation, and the third operation.

13. The semiconductor device according to claim 1, wherein the drive controller causes, in the third operation, the first voltage to be higher than the second voltage.

14. The semiconductor device according to claim 1, wherein the drive controller causes, in the fourth operation, the first voltage to be higher than the second voltage.

15. The semiconductor device according to claim 6, wherein the drive controller performs the fourth operation after the first operation.

16. The semiconductor device according to claim 6, wherein the drive controller performs the fourth operation after the second operation.

17. The semiconductor device according to claim 6, wherein the drive controller performs the fourth operation after the third operation.

18. The semiconductor device according to claim 6, wherein the drive controller consecutively performs the fourth operation immediately after at least one of the first operation, the second operation, or the third operation.

19. The semiconductor device according to claim 9, wherein the drive controller performs the fourth operation after the first operation.

20. The semiconductor device according to claim 9, wherein the drive controller performs the fourth operation after the second operation.

* * * * *